(12) United States Patent
Yamazaki et al.

(10) Patent No.: US 9,269,914 B2
(45) Date of Patent: Feb. 23, 2016

(54) LIGHT-EMITTING DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventors: Shunpei Yamazaki, Setagaya (JP); Yasuhiro Jinbo, Isehara (JP); Shingo Eguchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/339,911

(22) Filed: Jul. 24, 2014

(65) Prior Publication Data
US 2015/0035001 A1    Feb. 5, 2015

(30) Foreign Application Priority Data
Aug. 1, 2013    (JP) .................................. 2013-160042

(51) Int. Cl.
| | |
|---|---|
| H01L 33/00 | (2010.01) |
| H01L 51/00 | (2006.01) |
| H01L 51/52 | (2006.01) |
| H01L 33/56 | (2010.01) |
| H01L 27/32 | (2006.01) |

(52) U.S. Cl.
CPC ........ *H01L 51/0097* (2013.01); *H01L 51/5237* (2013.01); *H01L 51/5253* (2013.01); *H01L 27/323* (2013.01); *H01L 27/3244* (2013.01); *H01L 33/56* (2013.01); *H01L 2251/5338* (2013.01); *H01L 2251/5361* (2013.01)

(58) Field of Classification Search
CPC ....... G02F 1/161; G02F 1/155; G02F 1/0107; G02F 1/167; G02F 1/133305; G02F 1/1339; G02F 2201/50
See application file for complete search history.

(56) References Cited

U.S. PATENT DOCUMENTS

| | | | |
|---|---|---|---|
| 5,189,405 A * | 2/1993 | Yamashita et al. ............ 313/512 |
| 7,271,076 B2 | 9/2007 | Yamazaki et al. |
| 7,566,633 B2 | 7/2009 | Koyama et al. |
| 7,667,549 B2 | 2/2010 | Endo |
| 7,714,535 B2 | 5/2010 | Yamazaki et al. |
| 7,736,964 B2 | 6/2010 | Yamamoto et al. |
| 8,138,614 B2 | 3/2012 | Yamazaki et al. |
| 8,222,666 B2 | 7/2012 | Hatano et al. |
| 8,232,621 B2 | 7/2012 | Yamazaki et al. |

(Continued)

FOREIGN PATENT DOCUMENTS

JP    2003-174153    6/2003

*Primary Examiner* — A. Sefer
(74) *Attorney, Agent, or Firm* — Robinson Intellectual Property Law Office; Eric J. Robinson

(57) ABSTRACT

A lightweight flexible light-emitting device that is less likely to be broken is provided. The light-emitting device includes a first flexible substrate, a second flexible substrate, an element layer, a first bonding layer, and a second bonding layer. The element layer includes a light-emitting element. The element layer is provided between the first flexible substrate and the second flexible substrate. The first bonding layer is provided between the first flexible substrate and the element layer. The second bonding layer is provided between the second flexible substrate and the element layer. The first and second bonding layers are in contact with each other on the outer side of an end portion of the element layer. The first and second flexible substrates are in contact with each other on the outer side of the end portions of the element layer, the first bonding layer, and the second bonding layer.

17 Claims, 14 Drawing Sheets

(56) References Cited

U.S. PATENT DOCUMENTS

| | | |
|---|---|---|
| 8,237,248 B2 | 8/2012 | Yamazaki et al. |
| 8,264,144 B2 | 9/2012 | Oikawa et al. |
| 8,284,369 B2 | 10/2012 | Chida et al. |
| 8,415,208 B2 | 4/2013 | Takayama et al. |
| 8,432,254 B2 | 4/2013 | Koyama et al. |
| 8,760,046 B2 | 6/2014 | Seo et al. |
| 8,766,269 B2 | 7/2014 | Yamazaki et al. |
| 2004/0099926 A1 | 5/2004 | Yamazaki et al. |
| 2007/0152956 A1* | 7/2007 | Danner et al. ............... 345/107 |
| 2009/0128019 A1* | 5/2009 | Schaepkens et al. ......... 313/504 |
| 2010/0039802 A1* | 2/2010 | Tuan ............................ 362/185 |
| 2014/0065430 A1 | 3/2014 | Yamazaki et al. |

* cited by examiner

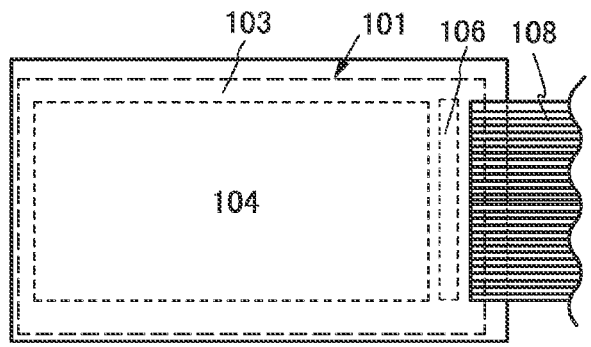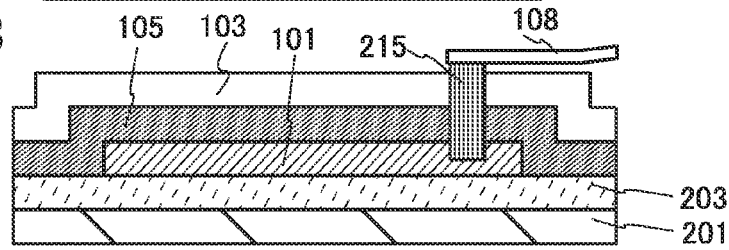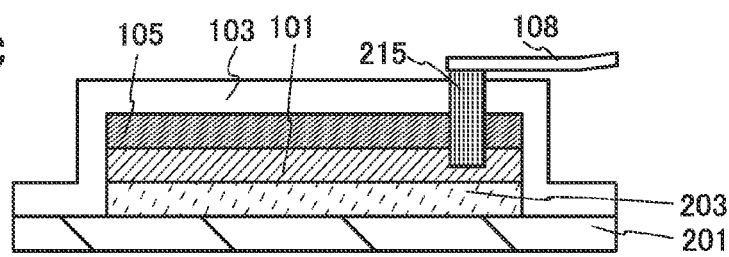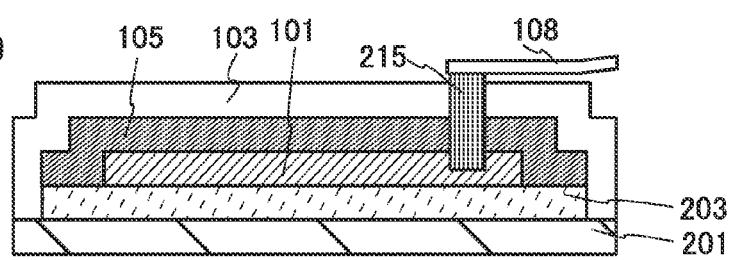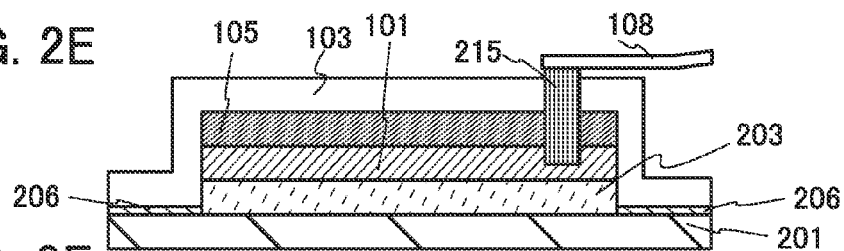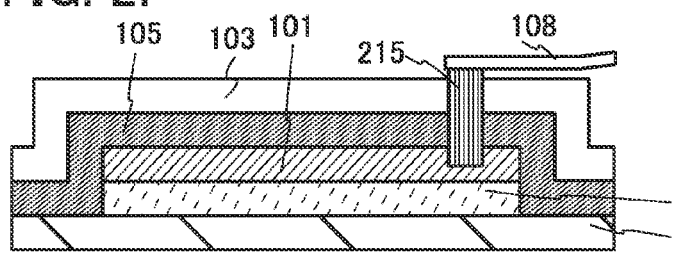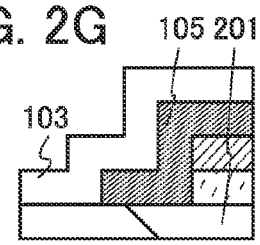

LIGHT-EMITTING DEVICE, ELECTRONIC DEVICE, AND LIGHTING DEVICE

BACKGROUND OF THE INVENTION

1. Field of the Invention

The present invention relates to an object, a method, and a manufacturing method. In addition, the present invention relates to a process, a machine, manufacture, and a composition of matter. One embodiment of the present invention particularly relates to a semiconductor device, a light-emitting device, a display device, an electronic device, a lighting device, and a manufacturing method thereof. One embodiment of the present invention particularly relates to a light-emitting device, a display device, an electronic device, and a lighting device utilizing electroluminescence (hereinafter also referred to as EL) and a manufacturing method thereof.

2. Description of the Related Art

Recent light-emitting devices and display devices are expected to be applied to a variety of uses and become diversified.

For example, light-emitting devices and display devices for mobile devices and the like are required to be thin, lightweight, and less likely to be broken.

Light-emitting elements utilizing EL (also referred to as EL elements) have features such as ease of thinning and lightening, high-speed response to input signal, and driving with a direct-current low voltage source; therefore, application of the light-emitting elements to light-emitting devices and display devices has been proposed.

For example, Patent Document 1 discloses a flexible active matrix light-emitting device in which an organic EL element and a transistor serving as a switching element are provided over a film substrate.

PATENT DOCUMENT

[Patent Document 1] Japanese Published Patent Application No. 2003-174153

SUMMARY OF THE INVENTION

An object of one embodiment of the present invention is to provide a novel light-emitting device, display device, electronic device, or lighting device. Another object of one embodiment of the present invention is to provide a lightweight light-emitting device, display device, electronic device, or lighting device. Another object of one embodiment of the present invention is to provide a highly reliable light-emitting device, display device, electronic device, or lighting device. Another object of one embodiment of the present invention is to provide a light-emitting device, display device, electronic device, or lighting device that is less likely to be broken. Another object of one embodiment of the present invention is to provide a thin light-emitting device, display device, electronic device, or lighting device. Another object of one embodiment of the present invention is to provide a light-emitting device, display device, electronic device, or lighting device with high light extraction efficiency. Another object of one embodiment of the present invention is to provide a light-emitting device, display device, electronic device, or lighting device with high luminance. Another object of one embodiment of the present invention is to provide a light-emitting device, display device, electronic device, or lighting device with low power consumption.

Another object of one embodiment of the present invention is to provide a lightweight flexible light-emitting device, display device, electronic device, or lighting device that is less likely to be broken.

Note that in one embodiment of the present invention, there is no need to achieve all the objects.

A light-emitting device of one embodiment of the present invention includes a first flexible substrate, a second flexible substrate, an element layer, a first bonding layer, and a second bonding layer. The element layer includes a light-emitting element. The element layer is provided between the first flexible substrate and the second flexible substrate. The first bonding layer is provided between the first flexible substrate and the element layer. The second bonding layer is provided between the second flexible substrate and the element layer. The first bonding layer and the second bonding layer are in contact with each other on the outer side of an end portion of the element layer. The first flexible substrate and the second flexible substrate overlap with each other on the outer side of end portions of the element layer, the first bonding layer, and the second bonding layer. In one embodiment of the present invention, the first flexible substrate and the second flexible substrate may be in contact with each other.

Another embodiment of the present invention is a light-emitting device which includes a first flexible substrate, a second flexible substrate, an element layer, a first bonding layer, a second bonding layer, and a third bonding layer. The element layer includes a light-emitting element. The element layer is provided between the first flexible substrate and the second flexible substrate. The first bonding layer is provided between the first flexible substrate and the element layer. The second bonding layer is provided between the second flexible substrate and the element layer. The third bonding layer, the first flexible substrate, and the second flexible substrate overlap with one another on the outer side of end portions of the element layer, the first bonding layer, and the second bonding layer.

For example, it is preferable that the first flexible substrate and the second flexible substrate be attached to each other with a low-melting-point glass, a thermoplastic resin, or the like therebetween. In other words, it is preferable that the third bonding layer contain a low-melting-point glass or a thermoplastic resin.

Another embodiment of the present invention is a light-emitting device which includes a first flexible substrate, a second flexible substrate, an element layer, a first bonding layer, and a second bonding layer. The element layer includes a light-emitting element. The element layer is provided between the first flexible substrate and the second flexible substrate. The first bonding layer is provided between the first flexible substrate and the element layer. The second bonding layer is provided between the second flexible substrate and the element layer. The second bonding layer, the first flexible substrate, and the second flexible substrate overlap with one another on the outer side of end portions of the element layer and the first bonding layer. Furthermore, the first flexible substrate and the second flexible substrate may be in contact with each other on the outer side of end portions of the element layer, the first bonding layer, and the second bonding layer.

In the light-emitting device of each of the above embodiments, it is preferable that the absolute value of a difference between the thermal expansion coefficient of the first flexible substrate and the thermal expansion coefficient of the second flexible substrate be smaller than or equal to 10% of the thermal expansion coefficient of the first flexible substrate or the thermal expansion coefficient of the second flexible substrate.

In the light-emitting device of each of the above embodiments, it is preferable that the first flexible substrate and the second flexible substrate contain the same material.

An electronic device or a lighting device including the light-emitting device of each of the above embodiments is also one embodiment of the present invention.

Note that the light-emitting device in this specification includes, in its category, a display device using a light-emitting element. Further, the category of the light-emitting device in this specification includes a module in which a light-emitting element is provided with a connector such as an anisotropic conductive film or a TCP (tape carrier package); a module having a TCP at the end of which a printed wiring board is provided; and a module in which an IC (integrated circuit) is directly mounted on a light-emitting element by a COG (chip on glass) method. Furthermore, the category includes a light-emitting device which is used in lighting equipment or the like.

In one embodiment of the present invention, a novel light-emitting device, display device, electronic device, or lighting device can be provided. In one embodiment of the present invention, a lightweight light-emitting device, display device, electronic device, or lighting device can be provided. In one embodiment of the present invention, a highly reliable light-emitting device, display device, electronic device, or lighting device can be provided. In one embodiment of the present invention, a light-emitting device, display device, electronic device, or lighting device that is less likely to be broken can be provided. In one embodiment of the present invention, a thin light-emitting device, display device, electronic device, or lighting device can be provided. In one embodiment of the present invention, a light-emitting device, display device, electronic device, or lighting device with high light extraction efficiency can be provided. In one embodiment of the present invention, a light-emitting device, display device, electronic device, or lighting device with high luminance can be provided. In one embodiment of the present invention, a light-emitting device, display device, electronic device, or lighting device with low power consumption can be provided.

In one embodiment of the present invention, a lightweight flexible light-emitting device, display device, electronic device, or lighting device that is less likely to be broken can be provided.

BRIEF DESCRIPTION OF THE DRAWINGS

FIGS. 2A to 2G illustrate light-emitting devices.

DETAILED DESCRIPTION OF THE INVENTION

Figure 1A:
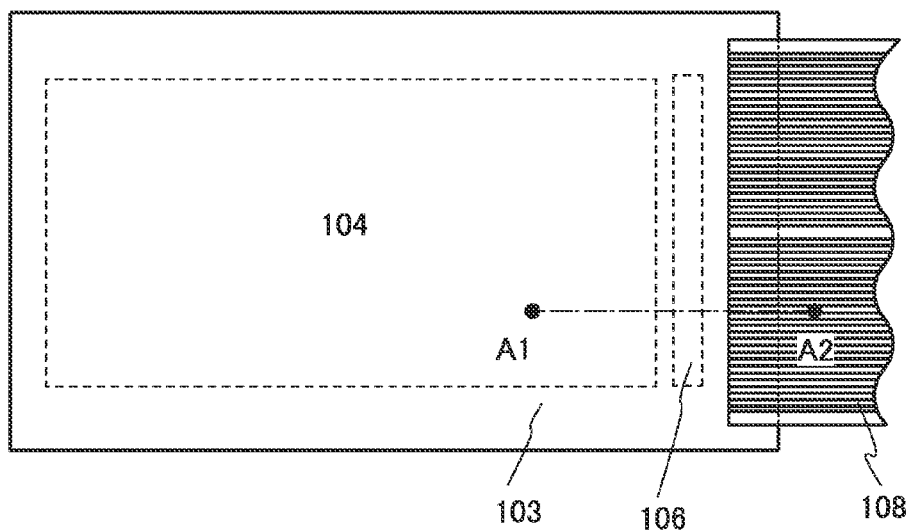
FIGS. 1A to 1C illustrate light-emitting devices.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatch pattern is applied to similar functions, and these are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

(Embodiment 1)

In this embodiment, a light-emitting device of one embodiment of the present invention will be described with reference to FIGS. 1A to 1C, FIGS. 2A to 2G, FIGS. 3A and 3B, FIGS. 4A and 4B, FIGS. 5A to 5C, FIGS. 6A to 6C, FIGS. 7A to 7C, FIGS. 13A and 13B, and FIGS. 14A and 14B.

A structure of the light-emitting device of one embodiment of the present invention will be described.

Figure 1B:
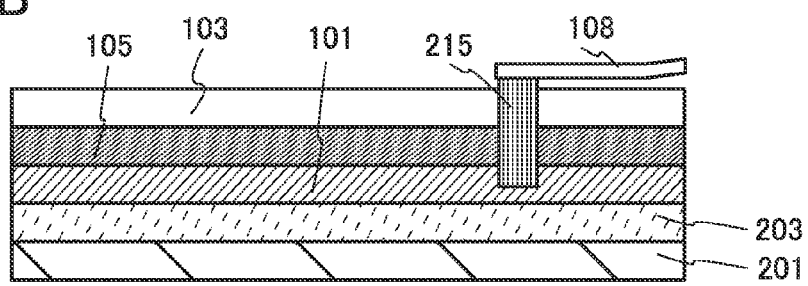

FIG. 1A illustrates a plan view of the light-emitting device of one embodiment of the present invention, and FIG. 1B illustrates a cross-sectional view of the light-emitting device of one embodiment of the present invention. The light-emitting device includes a light extraction portion 104 and a driver circuit portion 106.

In the light-emitting device illustrated in FIG. 1B, a flexible substrate 201, a bonding layer 203, an element layer 101, a bonding layer 105, and a flexible substrate 103 are sequentially stacked. The element layer 101 includes a light-emitting element. A conductive layer included in the element layer 101 and an FPC 108 are electrically connected to each other by a connector 215.

FIG. 2A illustrates a plan view of a light-emitting device of another embodiment of the present invention, and FIGS. 2B to 2G each illustrate a cross-sectional view of the light-emitting device of the other embodiment of the present invention. The light-emitting device includes a light extraction portion 104 and a driver circuit portion 106.

In the light-emitting device illustrated in FIG. 2B, a flexible substrate 201, a bonding layer 203, an element layer 101, a bonding layer 105, and a flexible substrate 103 are sequentially stacked. The element layer 101 includes a light-emitting element. A conductive layer included in the element layer 101 and an FPC 108 are electrically connected to each other by a connector 215.

An organic compound or a metal material used in the light-emitting element easily reacts with an impurity such as moisture or oxygen. The reaction of the organic compound or the metal material with the impurity results in a significant decrease in lifetime of the light-emitting element. In one embodiment of the present invention, the bonding layer 105 and the bonding layer 203 are in contact with each other on the outer side of an end portion of the element layer 101. Such a structure can suppress the entry of an impurity such as atmospheric moisture into the element layer 101. Accordingly, a decrease in reliability of the light-emitting device can be suppressed, which is preferable.

In the light-emitting device illustrated in FIG. 2C, a flexible substrate 201, a bonding layer 203, an element layer 101, a bonding layer 105, and a flexible substrate 103 are sequentially stacked. A conductive layer included in the element layer 101 and an FPC 108 are electrically connected to each other by a connector 215. The flexible substrate 201 and the flexible substrate 103 are in contact with each other on the outer side of an end portion of the element layer 101.

In order to increase the adhesion between the flexible substrate 201 and the flexible substrate 103, it is preferable that an adhesive, a glass frit (low-melting-point glass), a thermoplastic resin, or the like be placed in contact with the flexible substrate 201 and the flexible substrate 103 and be cured or welded. FIG. 2E illustrates an example in which the flexible substrate 201 and the flexible substrate 103 are attached 15 to each other with a bonding layer 206 provided on the outer side of an end portion of the element layer. For the bonding layer 206, an adhesive, a glass frit (low-melting-point glass), a thermoplastic resin, or the like can be used. Alternatively, the flexible substrate 201 and the flexible substrate 103 may be welded directly. The flexible substrate used in one embodiment of the present invention has a low thermal expansion coefficient and a high heat resistance; therefore, the light-emitting device is not easily damaged even by local heating such as thermocompression bonding. Such a structure is preferable because an impurity such as atmospheric moisture does not easily enter the element layer 101 and a decrease in reliability of the light-emitting device can be suppressed.

In the light-emitting device illustrated in FIG. 2D, a flexible substrate 201, a bonding layer 203, an element layer 101, a bonding layer 105, and a flexible substrate 103 are sequentially stacked. A conductive layer included in the element layer 101 and an FPC 108 are electrically connected to each other by a connector 215. The bonding layer 105 and the bonding layer 203 are in contact with each other on the outer side of an end portion of the element layer 101. The flexible substrate 201 and the flexible substrate 103 are in contact with each other on the outer side of end portions of the element layer 101, the bonding layer 203, and the bonding layer 105. As described for the light-emitting device illustrated in FIG. 2E, in order to increase the adhesion between the flexible substrate 201 and the flexible substrate 103, it is preferable that an adhesive, a glass frit (low-melting-point glass), a thermoplastic resin, or the like be placed in contact with the flexible substrate 201 and the flexible substrate 103 and be cured or welded. In other words, in addition to the structure in FIG. 2D, a bonding layer 206 may be provided on the outer side of the end portion of the element layer. Alternatively, the flexible substrate 201 and the flexible substrate 103 may be welded directly.

As in a light-emitting device illustrated in FIG. 2F, a bonding layer 105, a flexible substrate 201, and a flexible substrate 103 may overlap with one another on the outer side of end portions of an element layer 101 and a bonding layer 203. The bonding layer 105 covers the end portions of the element layer 101 and the bonding layer 203. The flexible substrate 201 and the flexible substrate 103 are attached to each other with the bonding layer 105 therebetween. Further, as illustrated in FIG. 2G, the flexible substrate 201 and the flexible substrate 103 may be in contact with each other on the outer side of end portions of the element layer 101, the bonding layer 203, and the bonding layer 105.

In the case where the flexible substrate 201 and the flexible substrate 103 are in contact with each other on the outer side of the end portion of the element layer 101 as illustrated in FIG. 2C, 2D, or 2G, the adhesion can be increased by using materials having similar properties. Therefore, it is preferable to use the same material for a pair of flexible substrates.

For the flexible substrates, a material such as glass, quartz, ceramics, sapphire, or an organic resin can be used.

Examples of glass include alkali-free glass, barium borosilicate glass, aluminoborosilicate glass, and the like.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

Note that in the light-emitting device of one embodiment of the present invention, a substrate having a poor light-transmitting property, such as a metal substrate, may be used as a flexible substrate which does not need to transmit light. There is no particular limitation on a material of the metal substrate, but it is preferable to use, for example, aluminum, copper, nickel, or a metal alloy such as an aluminum alloy or stainless steel.

In the light-emitting device of one embodiment of the present invention, it is preferable that the absolute value of a difference between the thermal expansion coefficients of the pair of flexible substrates be smaller than or equal to 10% of the thermal expansion coefficient of at least one of the pair of flexible substrates. By decreasing the difference between the thermal expansion coefficients of the pair of flexible substrates, the warpage of the light-emitting device to one side can be suppressed. A difference in the degree of expansion and contraction due to heat between the pair of flexible substrates is a cause of generation of a crack in the light-emitting device. Also in this regard, it is preferable to use the same material for the pair of flexible substrates. Accordingly, the difference between the thermal expansion coefficients of the pair of flexible substrates can be decreased.

<Specific Example 1>

Figure 1C:
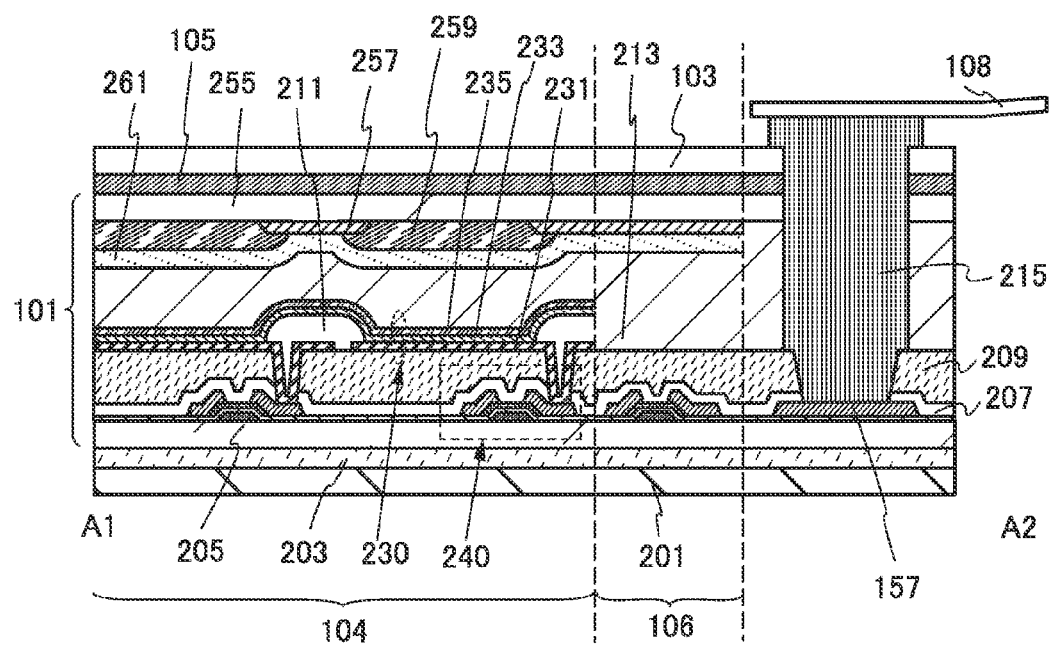

FIG. 1A is a plan view of the light-emitting device of one embodiment of the present invention, and FIG. 1C is an example of a cross-sectional view taken along dashed-dotted line A1-A2 in FIG. 1A.

The light-emitting device illustrated in FIG. 1C includes a flexible substrate 201, a bonding layer 203, an element layer 101, a bonding layer 105, and a flexible substrate 103. The element layer 101 includes an insulating layer 205, a plurality of transistors, a conductive layer 157, an insulating layer 207, an insulating layer 209, a plurality of light-emitting elements, an insulating layer 211, a bonding layer 213, an overcoat 261, a coloring layer 259, a light-blocking layer 257, and an insulating layer 255.

Figure 13A:
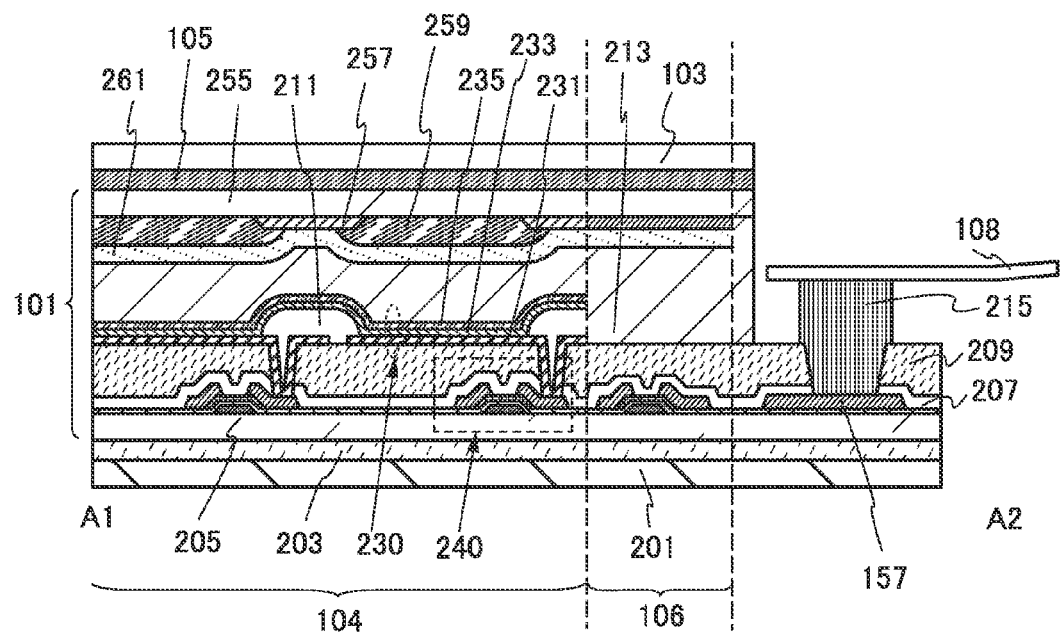
FIGS. 13A and 13B each illustrate a light-emitting device.

The conductive layer 157 is electrically connected to an FPC 108 via a connector 215. Note that FIG. 1C illustrates an example in which the FPC 108 overlaps with the flexible substrate 103; however, one embodiment of the present invention is not limited to this example. For example, in the case where the flexible substrate 103 has a smaller area than that of the flexible substrate 201 as illustrated in FIG. 13A, the FPC 108 may be provided in a region where the flexible substrate 201 and the flexible substrate 103 do not overlap with each other (in other words, the flexible substrate 103 and the FPC 108 do not necessarily overlap with each other).

A light-emitting element 230 includes a lower electrode 231, an EL layer 233, and an upper electrode 235. The lower electrode 231 is electrically connected to a source electrode or a drain electrode of a transistor 240. An end portion of the lower electrode 231 is covered with the insulating layer 211. The light-emitting element 230 has a top emission structure. The upper electrode 235 has a light-transmitting property and transmits light emitted from the EL layer 233.

The coloring layer 259 is provided to overlap with the light-emitting element 230, and the light-blocking layer 257 is provided to overlap with the insulating layer 211. The coloring layer 259 and the light-blocking layer 257 are covered with the overcoat 261. The space between the light-emitting element 230 and the overcoat 261 is filled with the bonding layer 213.

Figure 13B:
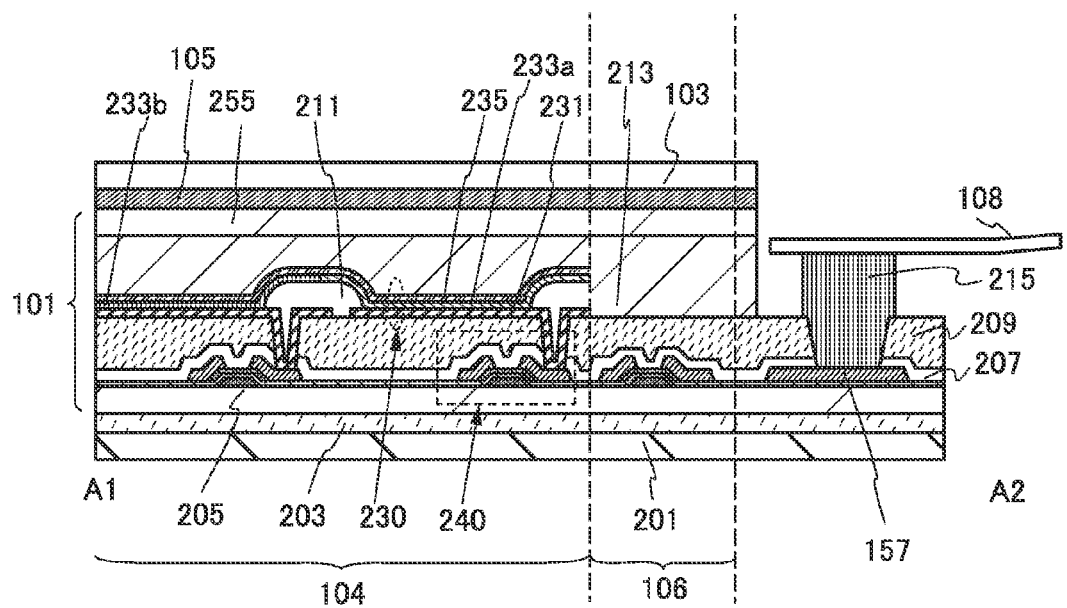

Note that the light-emitting device of one embodiment of the present invention may include the light-emitting element 230 which does not overlap with the coloring layer 259 as illustrated in FIG. 13B. For example, in the case where one pixel includes four sub-pixels which are red, blue, green, and white sub-pixels, the coloring layer 259 is not necessarily provided in the white sub-pixel. Accordingly, the amount of light absorbed by the coloring layer can be reduced, and thus, the power consumption of the light-emitting device can be reduced. With the use of different materials for an EL layer 233a and an EL layer 233b, light-emitting elements exhibiting different colors may be manufactured in pixels.

The light-emitting device includes a plurality of transistors including the transistor 240 in a light extraction portion 104 and a driver circuit portion 106. The transistor 240 is provided over the insulating layer 205. The insulating layer 205 and the flexible substrate 201 are attached to each other with the bonding layer 203. The insulating layer 255 and the flexible substrate 103 are attached to each other with the bonding layer 105. It is preferable to use films with low water permeability for the insulating layer 205 and the insulating layer 255, in which case an impurity such as water can be prevented from entering the light-emitting element 230 or the transistor 240, leading to improved reliability of the light-emitting device.

The light-emitting device in Specific Example 1 can be manufactured in the following manner: the insulating layer 205, the transistor 240, and the light-emitting element 230 are formed over a formation substrate with high heat resistance; the formation substrate is separated; and the insulating layer 205, the transistor 240, and the light-emitting element 230 are transferred to the flexible substrate 201 and attached thereto with the bonding layer 203. The light-emitting device in Specific Example 1 can be manufactured in the following manner: the insulating layer 255, the coloring layer 259, and the light-blocking layer 257 are formed over a formation substrate with high heat resistance; the formation substrate is separated; and the insulating layer 255, the coloring layer 259, and the light-blocking layer 257 are transferred to the flexible substrate 103 and attached thereto with the bonding layer 105.

In the case where a material with low heat resistance (e.g. resin) is used for a substrate, it is difficult to expose the substrate to high temperature in the manufacturing process. Thus, there is a limitation on conditions for forming a transistor and an insulating film over the substrate. Further, in the case where a material with high water permeability (e.g., resin) is used for a substrate of a light-emitting device, it is preferable to expose the substrate to high temperature and form a film with low water permeability between the substrate and a light-emitting element. In the manufacturing method of this embodiment, a transistor and the like can be formed over a formation substrate having high heat resistance; thus, the substrate can be exposed to high temperature and a highly reliable transistor and an insulating film with sufficiently low water permeability can be formed. Then, the transistor and the insulating film are transferred to a substrate with low heat resistance, whereby a highly reliable light-emitting device can be manufactured. Thus, with one embodiment of the present invention, a thin and/or lightweight light-emitting device with high reliability can be provided. Details of the manufacturing method will be described later.

In Specific Example 1, light emitted from the light-emitting element 230 is extracted through the flexible substrate 103. Therefore, a material which transmits visible light is used for the flexible substrate 103. It is preferable that the flexible substrate 103 have a visible-light transmittance higher than that of the bonding layer 105. In that case, a decrease in light extraction efficiency of the light-emitting device can be suppressed.

It is also preferable that the absolute value of a difference in thermal expansion coefficient between the flexible substrate 103 and the flexible substrate 201 be smaller than or equal to 10% of the thermal expansion coefficient of the flexible substrate 103 or the flexible substrate 201. In that case, it is possible to suppress warpage of the light-emitting device, generation of a crack in the light-emitting device, or the like.

In the case where the flexible substrate 201 and the flexible substrate 103 are in contact with each other on the outer side of the end portion of the element layer 101 as illustrated in FIG. 2C, 2D, or 2G, the adhesion can be increased by using materials having similar properties. This structure is preferable because an impurity such as atmospheric moisture does not easily enter the element layer 101 and a decrease in reliability of the light-emitting device can be suppressed. Further, as illustrated in FIG. 2B, 2E, or 2F, the flexible substrate 201 and the flexible substrate 103 may be attached to each other with the bonding layer 206, the bonding layer 105, or the like.

<Specific Example 2>

Figure 3A:
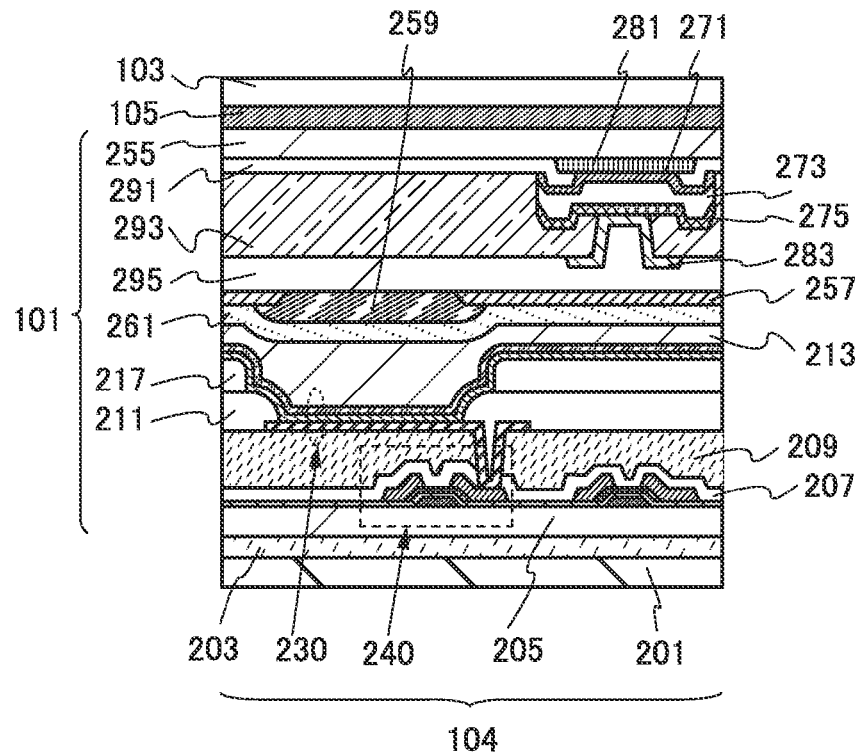
FIGS. 3A and 3B each illustrate a light-emitting device.

FIG. 3A illustrates another example of the light extraction portion 104 in the light-emitting device. The light-emitting device illustrated in FIG. 3A is capable of touch operation. In the following specific examples, description of components similar to those in Specific Example 1 is omitted.

The light-emitting device illustrated in FIG. 3A includes a flexible substrate 201, a bonding layer 203, an element layer 101, a bonding layer 105, and a flexible substrate 103. The element layer 101 includes an insulating layer 205, a plurality of transistors, an insulating layer 207, an insulating layer 209, a plurality of light-emitting elements, an insulating layer 211, an insulating layer 217, a bonding layer 213, an overcoat 261, a coloring layer 259, a light-blocking layer 257, a plurality of light-receiving elements, a conductive layer 281, a conductive layer 283, an insulating layer 291, an insulating layer 293, an insulating layer 295, and an insulating layer 255.

Specific Example 2 includes the insulating layer 217 over the insulating layer 211. The space between the flexible substrate 103 and the flexible substrate 201 can be adjusted with the insulating layer 217.

FIG. 3A illustrates an example in which a light-receiving element is provided between the insulating layer 255 and the bonding layer 213. Since the light-receiving element can be placed to overlap with a transistor or a wiring, the light-emitting device can be provided with a touch sensor without a decrease in the aperture ratio of a pixel (light-emitting element).

As the light-receiving element included in the light-emitting device, for example, a PN photodiode or a PIN photodiode can be used. In this embodiment, a PIN photodiode including a p-type semiconductor layer 271, an i-type semiconductor layer 273, and an n-type semiconductor layer 275 is used as the light-receiving element.

Note that the i-type semiconductor layer 273 is a semiconductor in which the concentration of each of an impurity imparting p-type conductivity and an impurity imparting n-type conductivity is $1 \times 10^{20}$ cm$^{-3}$ or less and which has photoconductivity 100 or more times as high as dark conductivity. The i-type semiconductor layer 273 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 273 includes, in its category, a semiconductor to which an impurity element imparting p-type conductivity is added intentionally or unintentionally at the time of deposition or after the deposition.

The light-blocking layer 257 is closer to the flexible substrate 201 than is the light-receiving element and overlaps with the light-receiving element. The light-blocking layer 257 between the light-receiving element and the bonding layer 213 can prevent the light-receiving element from being irradiated with light emitted from the light-emitting element 230.

The conductive layer 281 and the conductive layer 283 are electrically connected to the light-receiving element. The conductive layer 281 preferably transmits light incident on the light-receiving element. The conductive layer 283 preferably blocks light incident on the light-receiving element.

It is preferable to provide an optical touch sensor between the flexible substrate 103 and the bonding layer 213 because the optical touch sensor is less likely to be affected by light emitted from the light-emitting element 230 and can have improved S/N ratio.

The flexible substrate 103 and the flexible substrate 201 are preferably the same as those in Specific Example 1.

<Specific Example 3>

Figure 3B:
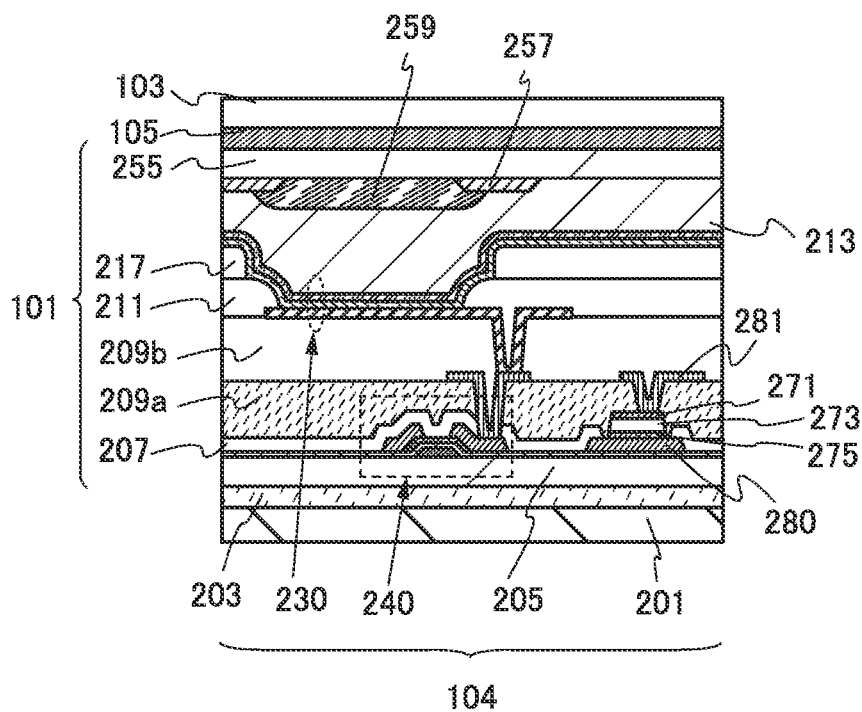

FIG. 3B illustrates another example of the light extraction portion 104 in the light-emitting device. The light-emitting device illustrated in FIG. 3B is capable of touch operation.

The light-emitting device illustrated in FIG. 3B includes a flexible substrate 201, a bonding layer 203, an element layer 101, a bonding layer 105, and a flexible substrate 103. The element layer 101 includes an insulating layer 205, a plurality of transistors, an insulating layer 207, an insulating layer 209a, an insulating layer 209b, a plurality of light-emitting elements, an insulating layer 211, an insulating layer 217, a bonding layer 213, a coloring layer 259, a light-blocking layer 257, a plurality of light-receiving elements, a conductive layer 280, a conductive layer 281, and an insulating layer 255.

FIG. 3B illustrates an example in which a light-receiving element is provided between the insulating layer 205 and the bonding layer 213. Since the light-receiving element is provided between the insulating layer 205 and the bonding layer 213, a conductive layer to which the light-receiving element is electrically connected and a photoelectric conversion layer included in the light-receiving element can be formed using the same materials and the same steps as a conductive layer and a semiconductor layer included in the transistor 240. Thus, the light-emitting device capable of touch operation can be manufactured without a significant increase in the number of manufacturing steps.

The flexible substrate 103 and the flexible substrate 201 are preferably the same as those in Specific Example 1.

<Specific Example 4>

Figure 4A:
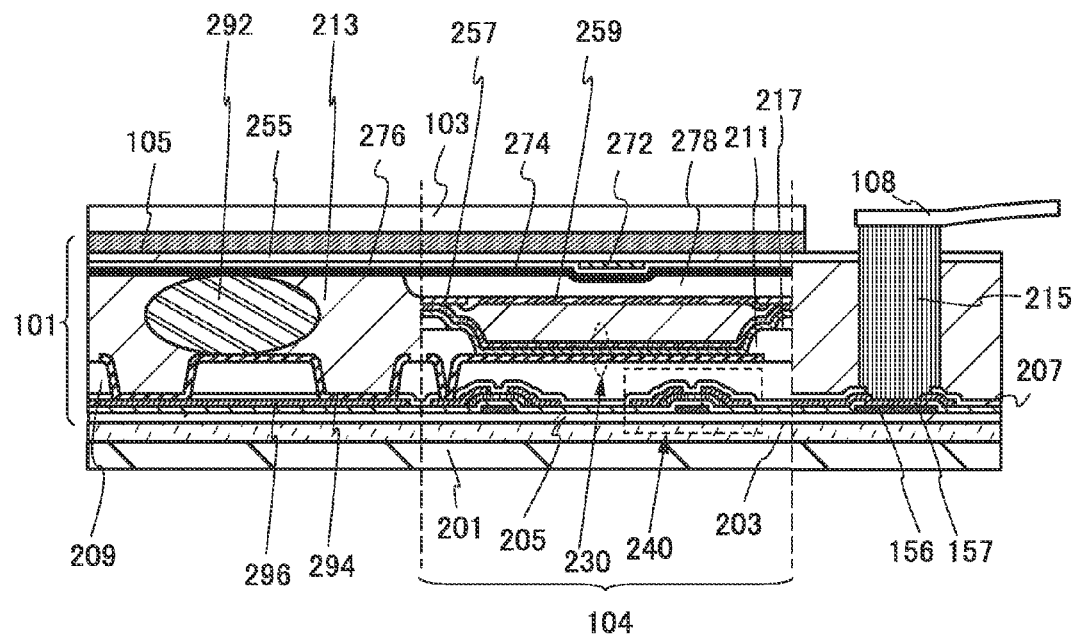
FIGS. 4A and 4B each illustrate a light-emitting device.

FIG. 4A illustrates another example of a light-emitting device. The light-emitting device illustrated in FIG. 4A is capable of touch operation.

The light-emitting device illustrated in FIG. 4A includes a flexible substrate 201, a bonding layer 203, an element layer 101, a bonding layer 105, and a flexible substrate 103. The element layer 101 includes an insulating layer 205, a plurality of transistors, a conductive layer 156, a conductive layer 157, an insulating layer 207, an insulating layer 209, a plurality of light-emitting elements, an insulating layer 211, an insulating layer 217, a bonding layer 213, a coloring layer 259, a light-blocking layer 257, an insulating layer 255, a conductive layer 272, a conductive layer 274, an insulating layer 276, an insulating layer 278, a conductive layer 294, and a conductive layer 296.

FIG. 4A illustrates an example in which a capacitive touch sensor is provided between the insulating layer 255 and the bonding layer 213. The capacitive touch sensor includes the conductive layer 272 and the conductive layer 274.

The conductive layer 156 and the conductive layer 157 are electrically connected to an FPC 108 via a connector 215. The conductive layer 294 and the conductive layer 296 are electrically connected to the conductive layer 274 via conductive particles 292. Thus, the capacitive touch sensor can be driven via the FPC 108.

The flexible substrate 103 and the flexible substrate 201 are preferably the same as those in Specific Example 1.

<Specific Example 5>

Figure 4B:
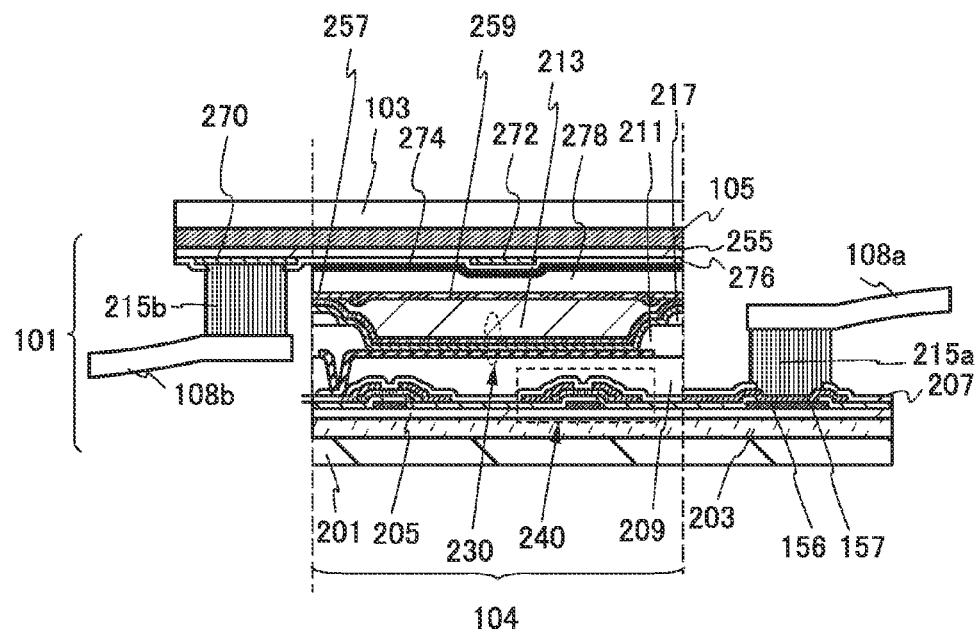

FIG. 4B illustrates another example of a light-emitting device. The light-emitting device illustrated in FIG. 4B is capable of touch operation.

The light-emitting device illustrated in FIG. 4B includes a flexible substrate 201, a bonding layer 203, an element layer 101, a bonding layer 105, and a flexible substrate 103. The element layer 101 includes an insulating layer 205, a plurality of transistors, a conductive layer 156, a conductive layer 157, an insulating layer 207, an insulating layer 209, a plurality of light-emitting elements, an insulating layer 211, an insulating layer 217, a bonding layer 213, a coloring layer 259, a light-blocking layer 257, an insulating layer 255, a conductive layer 270, a conductive layer 272, a conductive layer 274, an insulating layer 276, and an insulating layer 278.

FIG. 4B illustrates an example in which a capacitive touch sensor is provided between the insulating layer 255 and the bonding layer 213. The capacitive touch sensor includes the conductive layer 272 and the conductive layer 274.

Figure 14A:
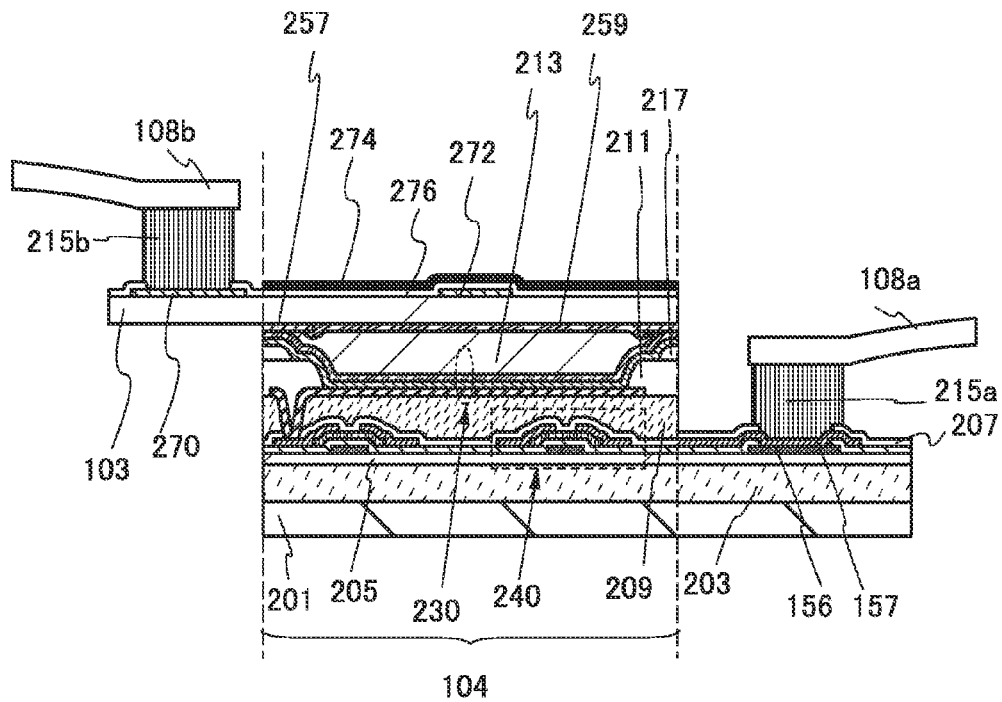
FIGS. 14A and 14B each illustrate a light-emitting device.
Figure 14B:
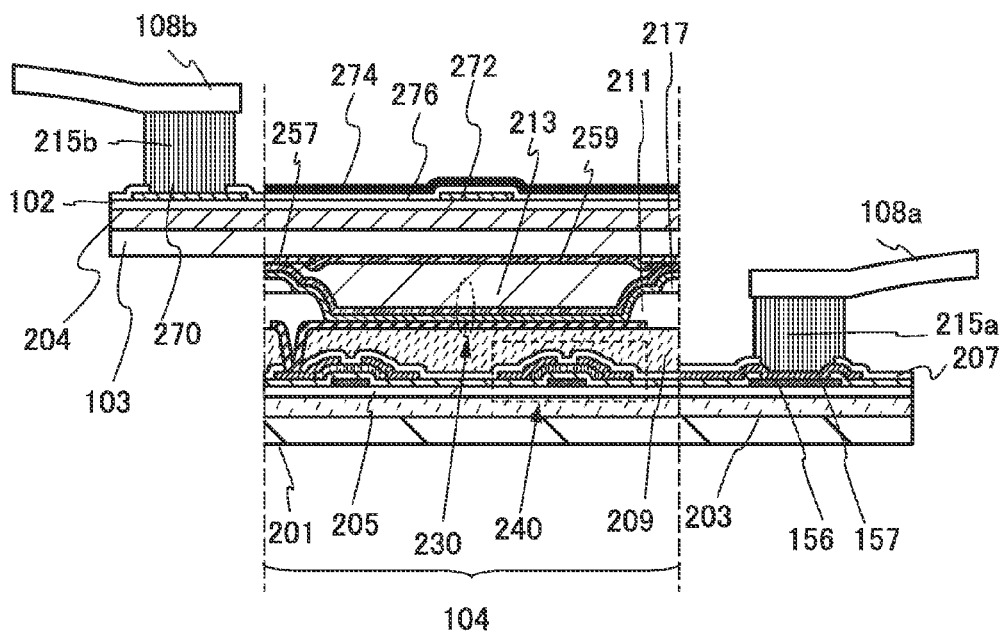

Note that the touch sensor may be provided over the flexible substrate 103 as illustrated in FIG. 14A. Alternatively, a flexible substrate 102 may be provided over the flexible substrate 103, and the touch sensor may be provided over the flexible substrate 102, as illustrated in FIG. 14B. The flexible substrate 103 and the flexible substrate 102 are attached to each other with a bonding layer 204. A material similar to that of the bonding layer 203 is preferably used for the bonding layer 204. Accordingly, light reflection can be suppressed. In addition, the occurrence of displacement at the time of bending the light-emitting device can be suppressed. Note that as in the structure illustrated in FIG. 4B, the insulating layer 255 and the bonding layer 105 may be provided between the flexible substrate 103 and the conductive layer 272.

The conductive layer 156 and the conductive layer 157 are electrically connected to an FPC 108a via a connector 215a. The conductive layer 270 is electrically connected to an FPC 108b via a connector 215b. Thus, the light-emitting element 230 and the transistor 240 can be driven via the FPC 108a, and the capacitive touch sensor can be driven via the FPC 108b.

The flexible substrate 103 and the flexible substrate 201 are preferably the same as those in Specific Example 1. The flexible substrate 102 can also be the same. Note that in Specific Example 5, light emitted from the light-emitting element 230 is extracted through the flexible substrate 103 (and the flexible substrate 102). Therefore, a material which transmits visible light is used for each of the flexible substrate 103 and the flexible substrate 102.

The same material is preferably used for the flexible substrate 102 and the flexible substrate 103. Accordingly, the difference in thermal expansion coefficient between the flexible substrate 102 and the flexible substrate 103 can be decreased. Furthermore, the same material is preferably used for the flexible substrate 201. Accordingly, the difference in thermal expansion coefficient between the flexible substrate 102, the flexible substrate 103, and the flexible substrate 201 can be decreased.

<Specific Example 6>

Figure 5A:
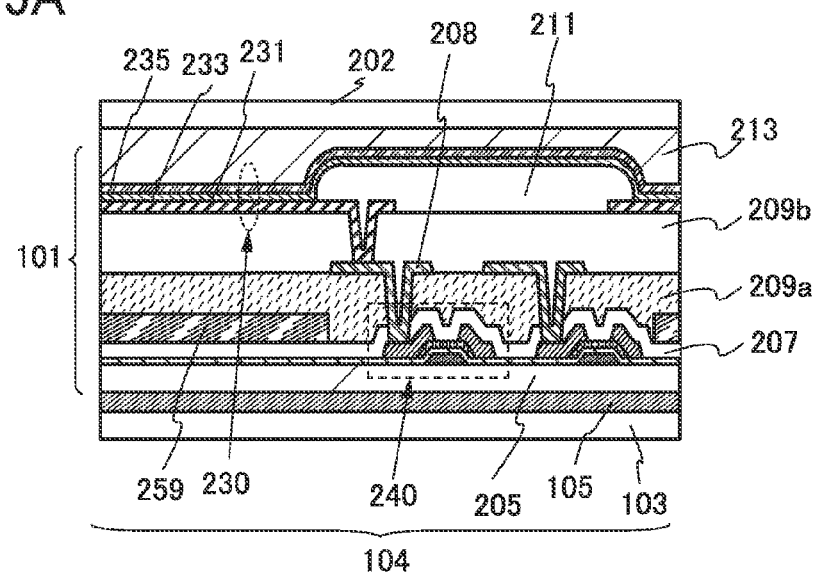
FIGS. 5A to 5C each illustrate a light-emitting device.

FIG. 5A illustrates another example of the light extraction portion 104 in the light-emitting device.

The light-emitting device illustrated in FIG. 5A includes a flexible substrate 103, a bonding layer 105, an element layer 101, a bonding layer 213, and a flexible substrate 202. The element layer 101 includes an insulating layer 205, a plurality of transistors, an insulating layer 207, a conductive layer 208, an insulating layer 209a, an insulating layer 209b, a plurality of light-emitting elements, an insulating layer 211, and a coloring layer 259.

A light-emitting element 230 includes a lower electrode 231, an EL layer 233, and an upper electrode 235. The lower electrode 231 is electrically connected to a source electrode or a drain electrode of a transistor 240 via the conductive layer 208. An end portion of the lower electrode 231 is covered with the insulating layer 211. The light-emitting element 230 has a bottom emission structure. The lower electrode 231 has a light-transmitting property and transmits light emitted from the EL layer 233.

The coloring layer 259 is provided to overlap with the light-emitting element 230, and light emitted from the light-emitting element 230 is extracted from the flexible substrate 103 side through the coloring layer 259. The space between the light-emitting element 230 and the flexible substrate 202 is filled with the bonding layer 213.

Figure 5B:
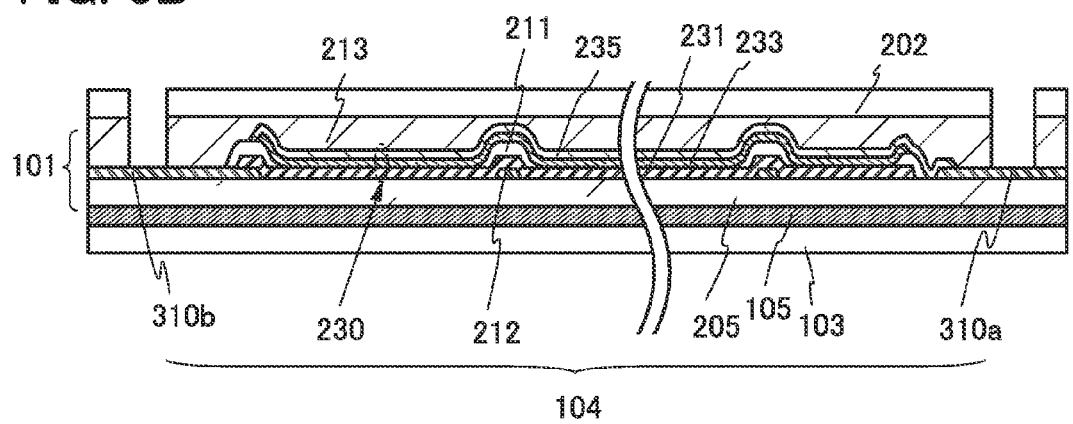
Figure 5C:
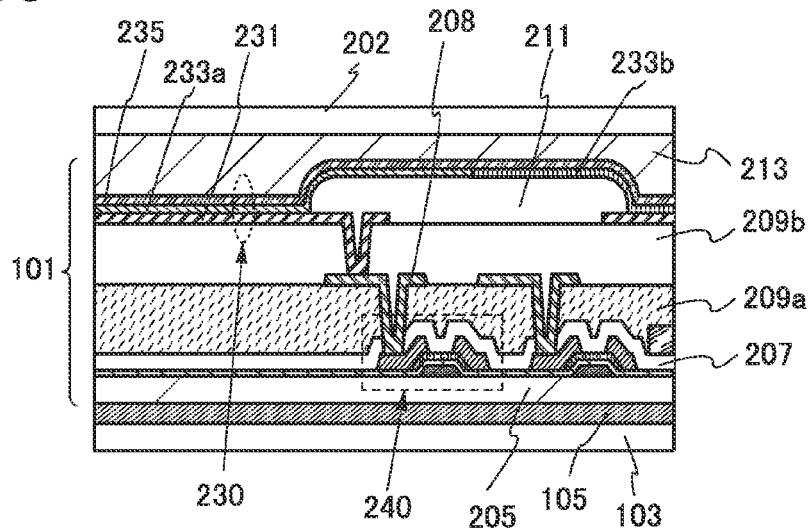

Note that the light-emitting device of one embodiment of the present invention may include the light-emitting element 230 which does not overlap with the coloring layer 259 as illustrated in FIG. 5C. For example, in the case where one pixel includes four sub-pixels which are red, blue, green, and white sub-pixels, the coloring layer 259 is not necessarily provided in the white sub-pixel. Accordingly, the amount of light absorbed by the coloring layer can be reduced, and thus, the power consumption of the light-emitting device can be reduced. With the use of different materials for an EL layer 233a and an EL layer 233b, light-emitting elements exhibiting different colors may be manufactured in pixels.

In Specific Example 6, light emitted from the light-emitting element 230 is extracted through the flexible substrate 103. Therefore, a material which transmits visible light is used for the flexible substrate 103.

It is also preferable that the absolute value of a difference in thermal expansion coefficient between the flexible substrate 103 and the flexible substrate 202 be smaller than or equal to 10% of the thermal expansion coefficient of the flexible substrate 103 or the flexible substrate 202.

In the case where the flexible substrate 202 and the flexible substrate 103 are in contact with each other on the outer side of the end portion of the element layer 101 as illustrated in FIG. 2C, 2D, or 2G, the adhesion can be increased by using materials having similar properties. This structure is preferable because an impurity such as atmospheric moisture does not easily enter the element layer 101 and a decrease in reliability of the light-emitting device can be suppressed. Further, as illustrated in FIG. 2B, 2E, or 2F, the flexible substrate 202 and the flexible substrate 103 may be attached to each other with the bonding layer 206, the bonding layer 105, or the like.

<Specific Example 7>

FIG. 5B illustrates another example of a light-emitting device.

The light-emitting device illustrated in FIG. 5B includes a flexible substrate 103, a bonding layer 105, an element layer 101, a bonding layer 213, and a flexible substrate 202. The element layer 101 includes an insulating layer 205, a conductive layer 310a, a conductive layer 310b, a plurality of light-emitting elements, an insulating layer 211, and a conductive layer 212.

The conductive layer 310a and the conductive layer 310b, which are external connection electrodes of the light-emitting device, can each be electrically connected to an FPC or the like.

A light-emitting element 230 includes a lower electrode 231, an EL layer 233, and an upper electrode 235. An end portion of the lower electrode 231 is covered with the insulating layer 211. The light-emitting element 230 has a bottom emission structure. The lower electrode 231 has a light-transmitting property and transmits light emitted from the EL layer 233. The conductive layer 212 is electrically connected to the lower electrode 231.

The flexible substrate 103 may have, as a light extraction structure, a hemispherical lens, a micro lens array, a film provided with an uneven surface structure, a light diffusing film, or the like. For example, the flexible substrate 103 with a light extraction structure can be formed by attaching the above lens or film to a resin substrate with an adhesive or the like having substantially the same refractive index as the substrate or the lens or film.

The conductive layer 212 is preferably, though not necessarily, provided because voltage drop due to the resistance of the lower electrode 231 can be prevented. In addition, for a similar purpose, a conductive layer electrically connected to the upper electrode 235 may be provided over the insulating layer 211, the EL layer 233, the upper electrode 235, or the like.

The conductive layer 212 can be a single layer or a stacked layer formed using a material selected from copper, titanium, tantalum, tungsten, molybdenum, chromium, neodymium, scandium, nickel, or aluminum, an alloy material containing any of these materials as its main component, or the like. The thickness of the conductive layer 212 can be, for example, greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 235, metal particles forming the conductive layer aggregate; therefore, the surface of the conductive layer is rough and has many gaps. Thus, even when the conductive layer is formed over the insulating layer 211, for example, it is difficult for the EL layer 233 to completely cover the conductive layer; accordingly, the upper electrode and the conductive layer are electrically connected to each other easily, which is preferable.

The flexible substrate 103 and the flexible substrate 202 are preferably the same as those in Specific Example 6.

<Examples of Materials>

Next, materials and the like that can be used for a light-emitting device are described. Note that description on the components already described in this embodiment is omitted.

[Functional Element]

The element layer 101 includes at least a light-emitting element. As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The element layer 101 may further include a transistor for driving the light-emitting element, a touch sensor, or the like.

The structure of the transistors in the light-emitting device is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the light-emitting device includes a pair of electrodes (the lower electrode 231 and the upper electrode 235), and the EL layer 233 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Further, when a metal film or a metal oxide film is stacked on and in contact with an aluminum alloy film, oxidation of the aluminum alloy film can be prevented. Examples of a material for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 231 and the upper electrode 235, holes are injected to the EL layer 233 from the anode side and electrons are injected to the EL layer 233 from the cathode side. The injected electrons and holes are recombined in the EL layer 233 and a light-emitting substance contained in the EL layer 233 emits light.

The EL layer 233 includes at least a light-emitting layer. In addition to the light-emitting layer, the EL layer 233 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 233, either a low molecular compound or a high molecular compound can be used, and an inorganic compound may also be used. Each of the layers included in the EL layer 233 can be formed by any of the following methods: an evaporation method (including a vacuum evaporation method), a transfer method, a printing method, an inkjet method, a coating method, and the like.

In the element layer 101, the light-emitting element is preferably provided between a pair of insulating films with low water permeability. In that case, an impurity such as water can be prevented from entering the light-emitting element, leading to prevention of a decrease in the reliability of the light-emitting device.

As an insulating film with low water permeability, a film containing nitrogen and silicon (e.g., a silicon nitride film or a silicon oxynitride film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

[Bonding Layer]

For the bonding layer, any of a variety of types of curable adhesives, e.g., a light curable adhesive such as a UV curable adhesive, a reactive curable adhesive, a heat curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferred. Alternatively, a two-component type resin may be used. Still alternatively, a bonding sheet or the like may be used.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the light-emitting device.

The bonding layer 105 has a light-transmitting property and transmits at least light emitted from the light-emitting element included in the element layer 101. The refractive index of the bonding layer 105 is higher than that of the air.

In addition, it is preferable to mix a filler with a high refractive index (e.g., titanium oxide) into the resin, in which case the efficiency of light extraction from the light-emitting element can be improved. Accordingly, assuming that power consumption is the same, luminance can be increased. Furthermore, assuming that luminance is the same, power consumption can be decreased.

The bonding layer 105 may also include a scattering member for scattering light. For example, the bonding layer 105 can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

In the case where light emitted from the light-emitting element is extracted through the bonding layer 213, the bonding layer 213 can be the same as the bonding layer 105 described above.

[Insulating Layer]

The insulating layer 205 and the insulating layer 255 can each be formed using an inorganic insulating material. It is particularly preferable to use the insulating film with low water permeability, in which case a highly reliable light-emitting device can be provided.

The insulating layer 207 has an effect of preventing diffusion of impurities into a semiconductor included in the transistor. As the insulating layer 207, an inorganic insulating film such as a silicon oxide film, a silicon oxynitride film, a silicon nitride film, a silicon nitride oxide film, or an aluminum oxide film can be used.

As each of the insulating layers 209, 209a, and 209b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that the planarization insulating film may have a stacked structure of any of insulating films formed of these materials and inorganic insulating films.

The insulating layer 211 is provided to cover an end portion of the lower electrode 231. In order that the insulating layer 211 be favorably covered with the EL layer 233 and the upper electrode 235 formed thereover, a side wall of the insulating layer 211 preferably has a tilted surface with continuous curvature.

As a material for the insulating layer 211, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 211.

There is no particular limitation on the method for forming the insulating layer 211; a photolithography method, a sputtering method, an evaporation method, a droplet discharging method (e.g., an inkjet method), a printing method (e.g., a screen printing method or an off-set printing method), or the like may be used.

The insulating layer 217 can be formed using an inorganic insulating material, an organic insulating material, or the like. As the organic insulating material, for example, a negative or positive photosensitive resin, a non-photosensitive resin, or the like can be used. Instead of the insulating layer 217, a conductive layer may be formed. For example, the conductive layer can be formed using a metal material such as titanium or aluminum. When a conductive layer is used instead of the insulating layer 217 and the conductive layer is electrically connected to the upper electrode 235, voltage drop due to the resistance of the upper electrode 235 can be prevented. The insulating layer 217 may have either a tapered shape or an inverse tapered shape.

Each of the insulating layers 276, 278, 291, 293, and 295 can be formed using an inorganic insulating material or an organic insulating material. It is particularly preferable to use an insulating layer with a planarization function for each of the insulating layers 278 and 295 in order to reduce surface unevenness due to a sensor element.

[Conductive Layer]

Each of the conductive layers 156, 157, 294, and 296 can be formed using the same material and the same step as a conductive layer included in the transistor or the light-emitting element. The conductive layer 280 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 208, 212, 310a, and 310b can also be formed using any of the above metal materials, alloy materials, and conductive metal oxides.

Each of the conductive layers 272, 274, 281, and 283 is a conductive layer with a light-transmitting property. The conductive layer can be formed using, for example, indium oxide, ITO, indium zinc oxide, zinc oxide, zinc oxide to which gallium is added, or the like. The conductive layer 270 can be formed using the same material and the same step as the conductive layer 272.

As the conductive particles 292, particles of an organic resin, silica, or the like coated with a metal material are used. It is preferable to use nickel or gold as the metal material because contact resistance can be reduced. It is also preferable to use particles each coated with layers of two or more kinds of metal materials, such as particles coated with nickel and further with gold.

For the connector 215, it is possible to use a paste-like or sheet-like material which is obtained by mixture of metal particles and a heat-curable resin and for which anisotropic electric conductivity is provided by thermocompression bonding. As the metal particles, particles in which two or more kinds of metals are layered, for example, nickel particles coated with gold, are preferably used.

[Coloring Layer, Light-Blocking Layer, and Overcoat]

The coloring layer 259 is a coloring layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 257 is provided between the adjacent coloring layers 259. The light-blocking layer 257 blocks light emitted from the adjacent light-emitting element, thereby preventing color mixture between adjacent pixels. Here, the coloring layer 259 is provided such that its end portion overlaps with the light-blocking layer 257, whereby light leakage can be prevented. The light-blocking layer 257 can be formed using a material that blocks light emitted from the light-emitting element, for example, a metal material, a resin material including a pigment or a dye, or the like. Note that as illustrated in FIG. 1C, the light-blocking layer 257 is preferably provided also in a region other than the light extraction portion 104, such as the driver circuit portion 106, in which case undesired leakage of guided light or the like can be prevented.

The overcoat 261 may be provided to cover the coloring layer 259 and the light-blocking layer 257. With the overcoat, impurities and the like contained in the coloring layer can be prevented from being diffused into an organic EL element. The overcoat is formed with a material that transmits light emitted from the organic EL element; for example, an inorganic insulating film such as a silicon nitride film or a silicon oxide film, an organic insulating film such as an acrylic film or a polyimide film can be used, and further, a stacked structure of an organic insulating film and an inorganic insulating film may be employed. The insulating film with low water permeability may be used for the overcoat 261.

In the case where a material of the bonding layer 213 is applied to the coloring layer 259 and the light-blocking layer 257, a material with high wettability with respect to the material of the bonding layer 213 is preferably used as a material of the overcoat 261. For example, an oxide conductive film such as an ITO film or a metal film such as an Ag film which is thin enough to transmit light is preferably used.

<Example of Manufacturing Method>

Next, an example of a method for manufacturing a light-emitting device will be described with reference to FIGS. 6A to 6C and FIGS. 7A to 7C. Here, the manufacturing method is described using the light-emitting device of Specific Example 1 (FIG. 1C) as an example.

Figure 6A:
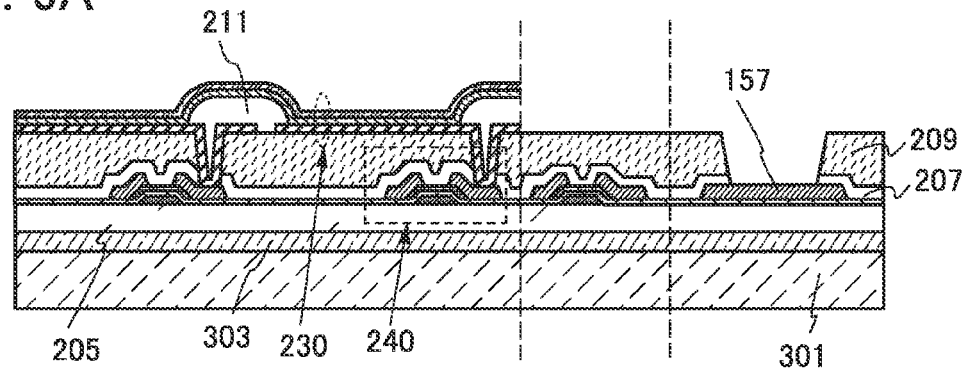
FIGS. 6A to 6C illustrate a method for manufacturing a light-emitting device.

First, a separation layer 303 is formed over a formation substrate 301, and the insulating layer 205 is formed over the separation layer 303. Next, the plurality of transistors, the conductive layer 157, the insulating layer 207, the insulating layer 209, the plurality of light-emitting elements, and the insulating layer 211 are formed over the insulating layer 205. An opening is formed in the insulating layers 211, 209, and 207 to expose the conductive layer 157 (FIG. 6A).

Figure 6B:
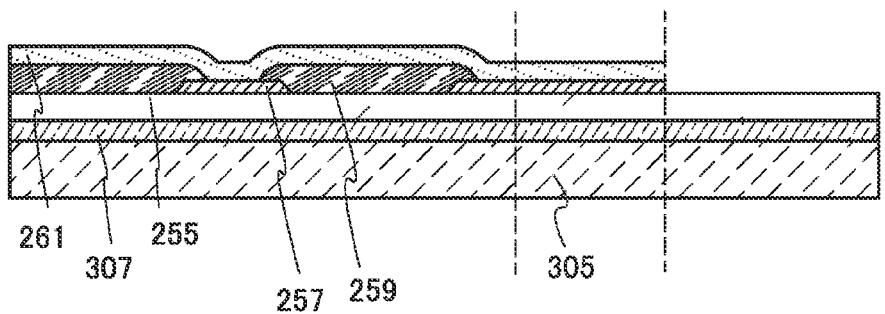

In addition, a separation layer 307 is formed over a formation substrate 305, and the insulating layer 255 is formed over the separation layer 307. Next, the light-blocking layer 257, the coloring layer 259, and the overcoat 261 are formed over the insulating layer 255 (FIG. 6B).

The formation substrate 301 and the formation substrate 305 can each be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Note that when containing a large amount of barium oxide (BaO), the glass substrate can be heat-resistant and more practical. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 303 and the separation layer 307 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating layer formed later can be controlled.

Each of the insulating layers can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low water permeability.

Figure 6C:
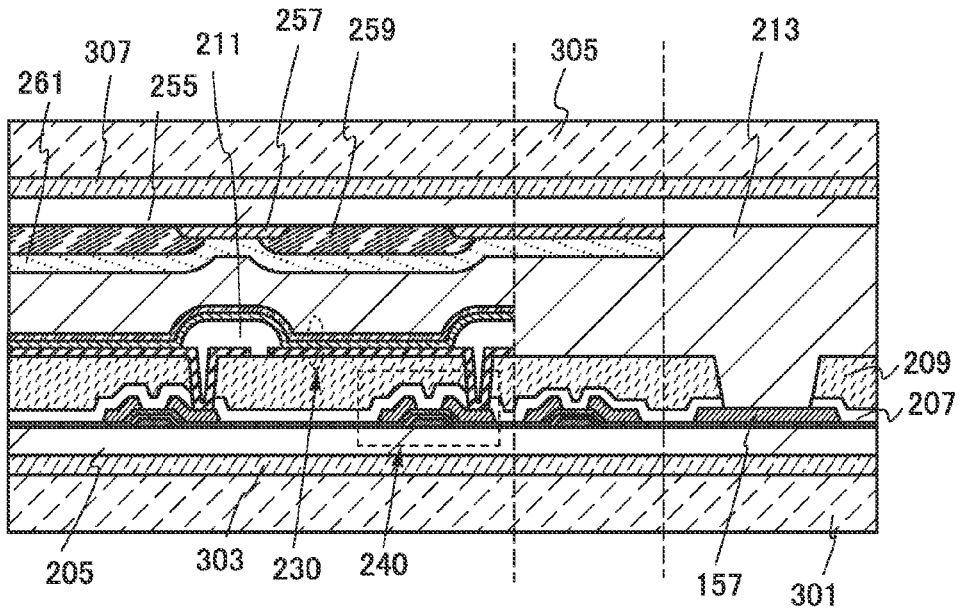

Then, a material for the bonding layer 213 is applied to a surface of the formation substrate 305 over which the coloring layer 259 and the like are formed or a surface of the formation substrate 301 over which the light-emitting element 230 and the like are formed, and the formation substrate 301 and the formation substrate 305 are attached so that these two surfaces face each other with the bonding layer 213 positioned therebetween (FIG. 6C).

Next, the formation substrate 301 is separated, and the exposed insulating layer 205 and the flexible substrate 201 are attached to each other with the bonding layer 203. Further, the formation substrate 305 is separated, and the exposed insulating layer 255 and the flexible substrate 103 are attached to each other with the bonding layer 105. Although the flexible substrate 103 does not overlap with the conductive layer 157 in FIG. 7A, the flexible substrate 103 may overlap with the conductive layer 157.

Any of a variety of methods can be used as appropriate for the separation process. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Further, the separation process can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be carried out by filling the interface between the separation layer and the layer to be separated with a liquid. Further, the separation may be conducted while pouring a liquid such as water.

As another separation method, in the case where the separation layer is formed using tungsten, it is preferable that the separation be performed while etching the separation layer using a mixed solution of ammonia water and a hydrogen peroxide solution.

Note that the separation layer is not necessary in the case where separation at the interface between the formation substrate and the layer to be separated is possible. For example, glass is used as the formation substrate, an organic resin such as polyimide, polyester, polyolefin, polyamide, polycarbonate, or acrylic is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated. In that case, the organic resin can be used as a substrate of the light-emitting device. Furthermore, the organic resin and another substrate may be attached to each other with an adhesive.

Figure 7A:
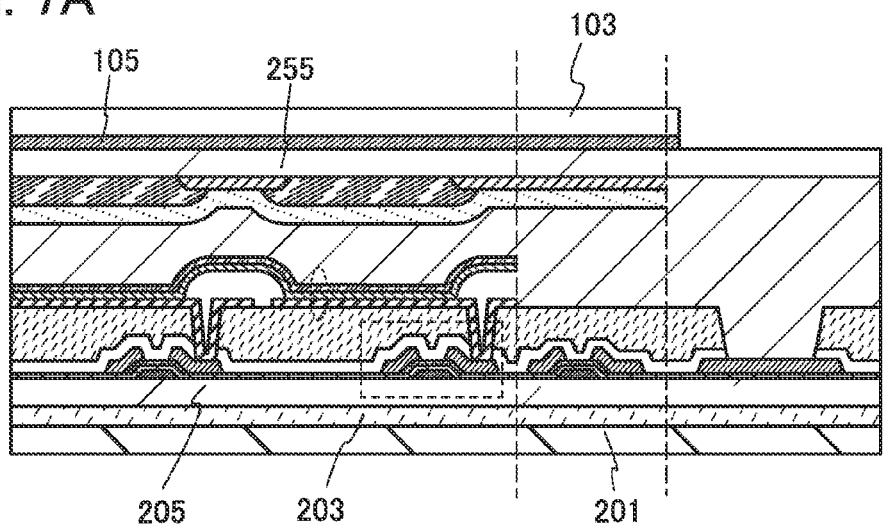
FIGS. 7A to 7C illustrate a method for manufacturing a light-emitting device.
Figure 7B:
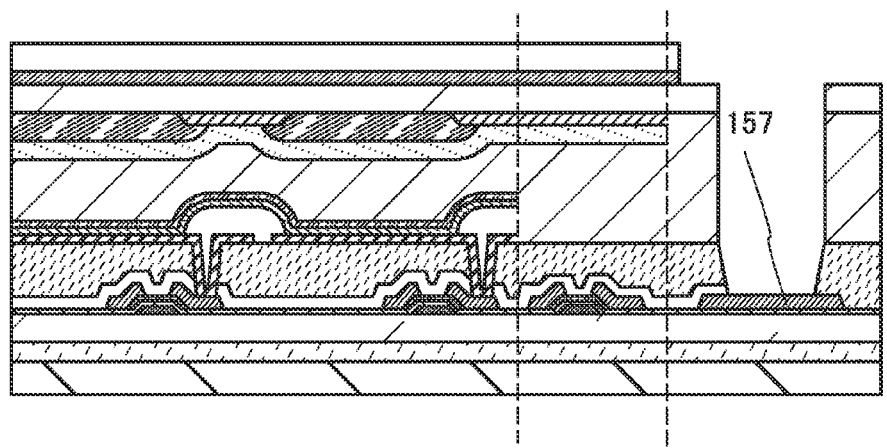
Figure 7C:
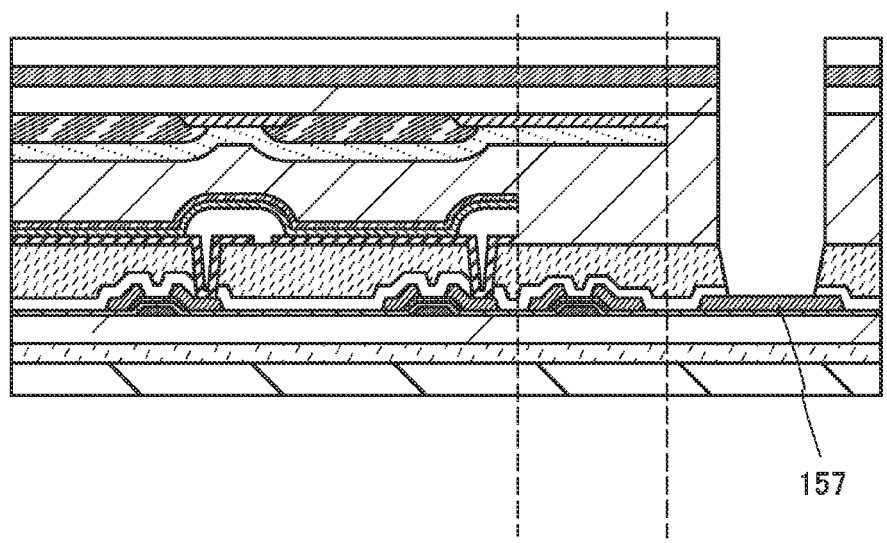

Lastly, an opening is formed in the insulating layer 255 and the bonding layer 213 to expose the conductive layer 157 (FIG. 7B). In the case where the flexible substrate 103 overlaps with the conductive layer 157, the opening is formed also in the flexible substrate 103 and the bonding layer 105 so that the conductive layer 157 is exposed (FIG. 7C). The method for forming the opening is not particularly limited and may be, for example, a laser ablation method, an etching method, an ion beam sputtering method, or the like. As another method, a cut may be made in a film over the conductive layer 157 with a sharp knife or the like and part of the film may be separated by physical force.

In the above-described manner, the light-emitting device can be manufactured.

As described above, the light-emitting device of this embodiment includes two substrates: one is the flexible substrate 103 and the other is the flexible substrate 201 or the flexible substrate 202. The light-emitting device can be formed with two substrates even when including a touch sensor. Owing to the use of the minimum number of substrates, improvement in light extraction efficiency and improvement in clarity of display can be easily achieved. Accordingly, assuming that power consumption is the same, luminance can be increased. Furthermore, assuming that luminance is the same, power consumption can be decreased.

Note that the light-emitting device including the light-emitting element is described in this embodiment as an example; however, one embodiment of the present invention is not limited to this example. A variety of semiconductor devices and a variety of display devices can be given as examples of devices in which flexible substrates that are a feature of one embodiment of the present invention can be used. For example, flexible substrates that are a feature of one embodiment of the present invention can be used as substrates in the following elements or devices. Examples include an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), MIRASOL (registered trademark), an interferometic modulator display (IMOD), an electrowetting element, a piezoelectric ceramic display, or a carbon nanotube, which are display media whose contrast, luminance, reflectivity, transmittance, or the like is changed by electromagnetic action. Examples further include a display device having electron emitters, such as a field emission display (FED) or an SED-type flat panel display (SED: surface-conduction electron-emitter display). Examples further include a display device having a liquid crystal element, such as a liquid crystal display (e.g., a transmissive liquid crystal display, a transflective liquid crystal display, a reflective liquid crystal display, a direct-view liquid crystal display, or a projection liquid crystal display). Examples further include a display device including electronic ink or electrophoretic elements, such as electronic paper.

Display of electronic paper can be performed using, for example, molecules (a method utilizing optical anisotropy, dye molecular orientation, or the like), particles (a method utilizing electrophoresis, particle movement, particle rotation, phase change, or the like), movement of one end of a film, coloring properties or phase change of molecules, optical absorption by molecules, or self-light emission by combination of electrons and holes. Specific examples of a display method of electronic paper include microcapsule electrophoresis, horizontal electrophoresis, vertical electrophoresis, a spherical twisting ball, a magnetic twisting ball, a columnar twisting ball, a charged toner, electronic liquid powder, magnetic electrophoresis, a magnetic thermosensitive type, electro wetting, light-scattering (transparent-opaque change), a cholesteric liquid crystal and a photoconductive layer, cholesteric liquid crystal, bistable nematic liquid crystal, ferroelectric liquid crystal, a liquid crystal dispersed type with a dichroic dye, a movable film, coloring and decoloring properties of a leuco dye, photochromism, electrochromism, electrodeposition, and flexible organic EL. Note that one embodiment of the present invention is not limited to these examples, and various electronic paper and display methods can be used as electronic paper and a display method thereof. Here, with the use of microcapsule electrophoresis, aggregation and precipitation of electrophoretic particles can be prevented. Electronic liquid powder has advantages such as high-speed response, high reflectivity, wide viewing angle, low power consumption, and memory properties.

This embodiment can be combined with any of the other embodiments as appropriate.

(Embodiment 2)

In this embodiment, electronic devices to which one embodiment of the present invention is applied will be described with reference to FIGS. 8A to 8C, FIG. 9, FIGS. 10A to 10E, and FIGS. 11A to 11C.

An electronic device of this embodiment includes a strip-like high flexibility region and a strip-like low flexibility region that are arranged alternately. The electronic device can be folded by bending the high flexibility region. The electronic device of this embodiment is highly portable in a folded state, and is highly browsable in an opened state because of a seamless large light-emitting region.

In the electronic device of this embodiment, the high flexibility region can be bent either inward or outward.

Note that in this specification, being "bent inward" means being bent such that a light-emitting surface of a light-emitting device faces inward, and being "bent outward" means being bent such that a light-emitting surface of a light-emitting device faces outward. A light-emitting surface of an electronic device or a light-emitting device refers to a surface through which light emitted from a light-emitting element is extracted.

When the electronic device of this embodiment is not in use, it can be folded such that a light-emitting surface of a light-emitting device faces inward, whereby the light-emitting surface can be prevented from being damaged or contaminated.

When the electronic device of this embodiment is in use, it can be opened so that the seamless large light-emitting region is entirely used, or it can be folded such that the light-emitting surface of the light-emitting device faces outward and the light-emitting region can be partly used. Folding the electronic device and putting part of the light-emitting region that is hidden from a user in a non-light-emitting state can reduce the power consumption of the electronic device.

An electronic device that can be folded in three parts and includes two strip-like high flexibility regions and three strip-like low flexibility regions is described below as an example.

Figure 8A:
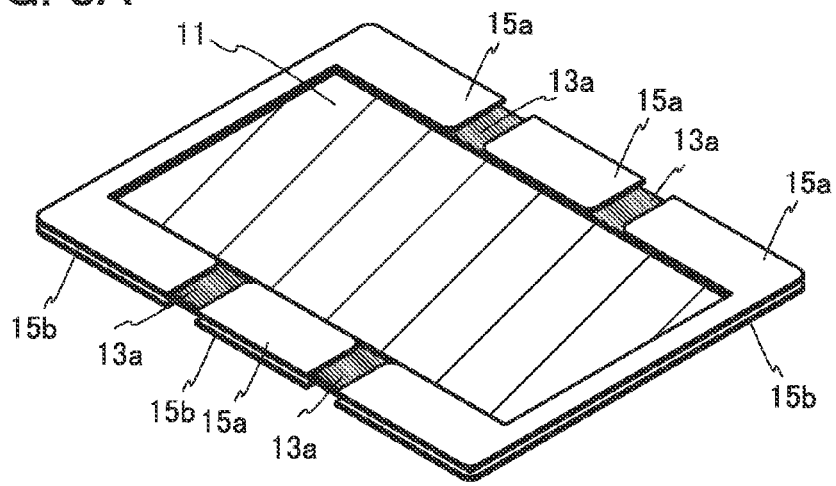
FIGS. 8A to 8C illustrate an electronic device.
Figure 8B:
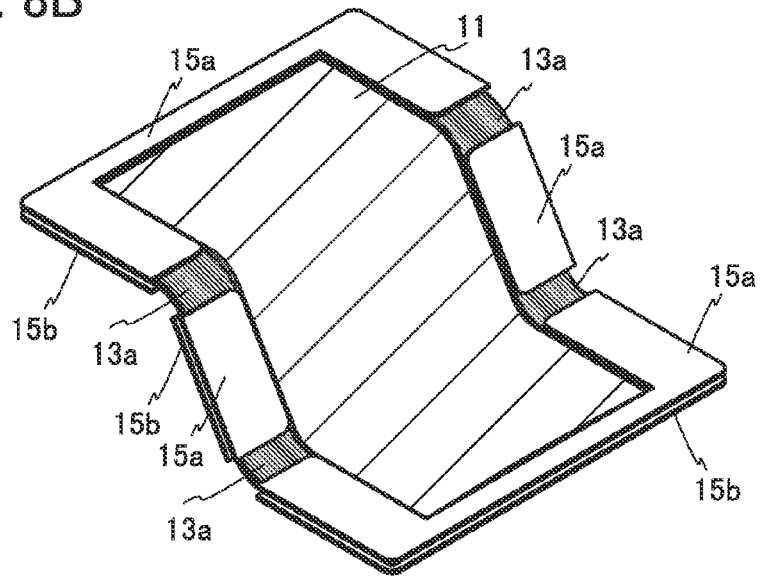
Figure 8C:
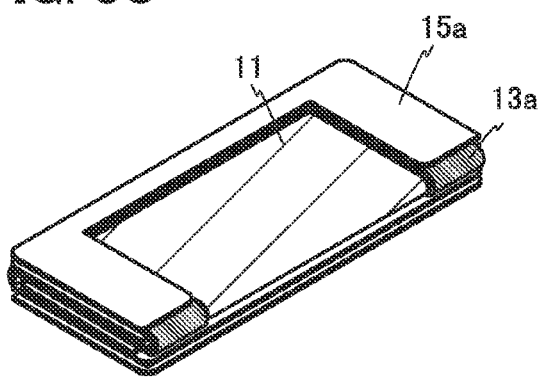
Figure 9:
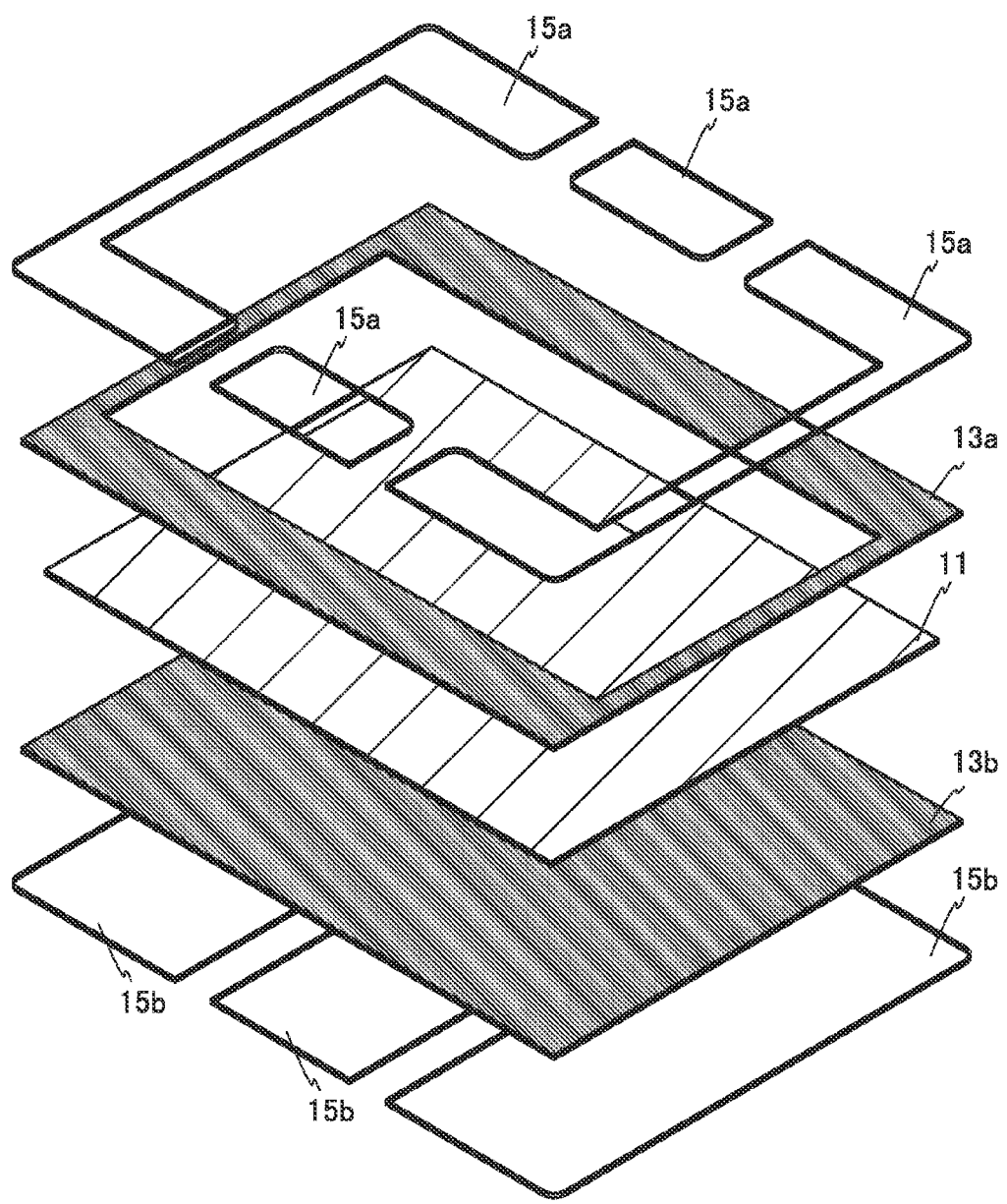
FIG. 9 illustrates an electronic device.
Figure 10A:
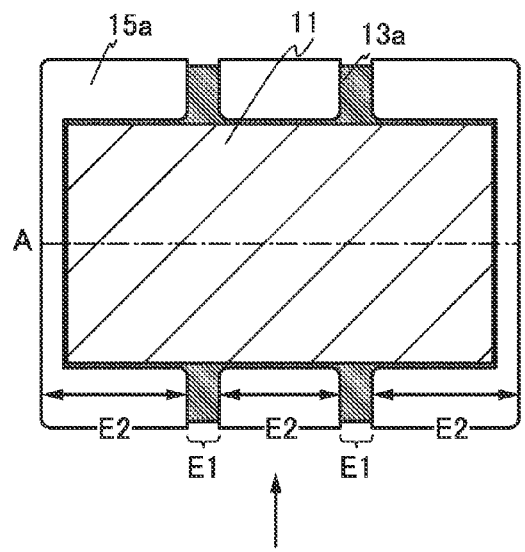
FIGS. 10A to 10E illustrate electronic devices.
Figure 10B:
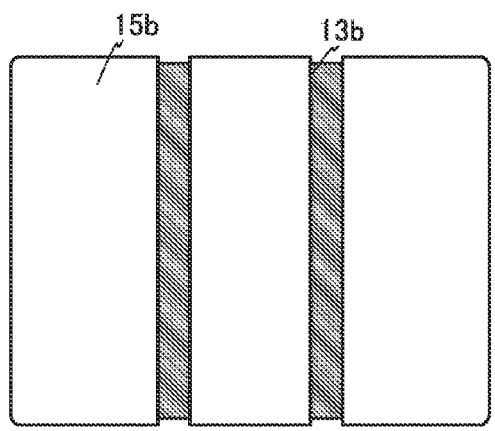
Figure 10C:
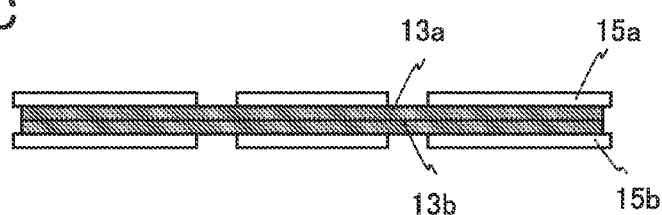
Figure 10D:
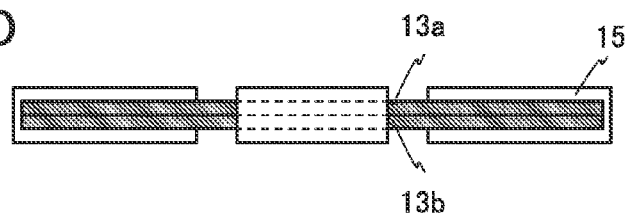
Figure 10E:
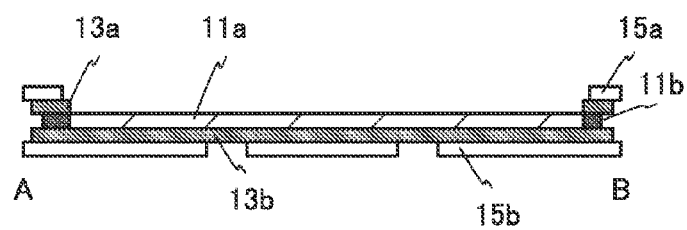

FIG. 8A illustrates the electronic device that is opened. FIG. 8B illustrates the electronic device that is being opened or being folded. FIG. 8C illustrates the electronic device that is folded. FIG. 9 is a perspective view illustrating components of the electronic device. FIG. 10A is a plan view of the light-emitting surface side of the electronic device, and FIG. 10B is a plan view of the side opposite to the light-emitting surface side of the electronic device. FIGS. 10C and 10D are examples of a side view of the electronic device in FIG. 10A that is viewed in the direction indicated by an arrow. FIG. 10E is a cross-sectional view taken along dashed-dotted line A-B in FIG. 10A.

The electronic device in FIGS. 8A to 8C includes a flexible light-emitting device 11. As the light-emitting device 11, the light-emitting device of one embodiment of the present invention which is described in Embodiment 1 can be used. The light-emitting device of one embodiment of the present invention can be folded, for example, with a radius of curvature greater than or equal to 1 mm and less than or equal to 100 mm and can thus be suitably used in an electronic device that is configured to be folded once or more by inward or outward bending.

The electronic device in FIGS. 8A to 8C further includes a plurality of support panels 15a and a plurality of support panels 15b. Each of the support panels 15a and 15b has a lower flexibility than that of the light-emitting device 11. The plurality of support panels 15a are apart from each other. The plurality of support panels 15b are apart from each other.

As illustrated in FIG. 10A, the electronic device includes high flexibility regions E1 and low flexibility regions E2 that are arranged alternately. The high flexibility region and the low flexibility region are strip-like regions (form stripes). In this embodiment, a plurality of high flexibility regions and a plurality of low flexibility regions are parallel to each other; however, the regions are not necessarily arranged parallel to each other.

The high flexibility region E1 in the electronic device includes at least a flexible light-emitting device. A light-emitting device using organic EL elements is particularly preferable because it not only has high flexibility and impact resistance but also can be thinned and lightened.

The low flexibility region E2 in the electronic device includes at least a flexible light-emitting device and a support panel having a lower flexibility than that of the light-emitting device and overlapping with the light-emitting device.

The support panel is provided on at least one of the light-emitting surface side and the side opposite to the light-emitting surface side of the light-emitting device.

The light-emitting device preferably has support panels on both the light-emitting surface side and the side opposite to the light-emitting surface side, like the support panels 15a and 15b illustrated in FIG. 10C, in which case the light-emitting device can be sandwiched between a pair of support panels; thus, the mechanical strength of the low flexibility region is increased and the electronic device becomes less likely to be broken.

Alternatively, a support panel 15 illustrated in FIG. 10D may be used instead of the support panels 15a and 15b and the light-emitting device 11 may be held by the support panel 15.

It is preferable that the light-emitting device have the support panel on only one of the light-emitting surface side and the side opposite to the light-emitting surface side because the electronic device can be thinner or more lightweight. For example, an electronic device that includes the plurality of support panels 15b and does not include the plurality of support panels 15a may be employed.

The high flexibility region E1 and the low flexibility region E2 preferably include the light-emitting device and a protective layer having a higher flexibility than that of the support panel and overlapping with the light-emitting device. In that case, the high flexibility region E1 in the electronic device can have high mechanical strength as well as flexibility and the electronic device becomes less likely to be broken. This structure makes the electronic device less likely to be broken by deformation due to external force or the like in the high flexibility region.

For example, it is preferable that the support panel be the thickest and the light-emitting device be the thinnest among the light-emitting device, the support panel, and the protective layer. Alternatively, for example, it is preferable that the support panel have the lowest flexibility and the light-emitting device have the highest flexibility among the light-emitting device, the support panel, and the protective layer. Such a structure increases the difference in flexibility between the high flexibility region and the low flexibility region. Thus, the electronic device can be folded reliably at the high flexibility region, so that the low flexibility region is prevented from being bent. Consequently, the reliability of the electronic device can be improved. Such a structure also prevents the electronic device from being bent at an undesired portion.

The light-emitting device preferably has protective layers on both the light-emitting surface side and the side opposite to the light-emitting surface side, in which case the light-emitting device can be sandwiched between a pair of protective layers; thus, the electronic device has increased mechanical strength and becomes less likely to be broken.

For example, as illustrated in FIG. 10C, in the low flexibility region E2, it is preferable that a pair of protective layers 13a and 13b be placed between the pair of support panels 15a and 15b and the light-emitting device (not illustrated) be placed between the pair of protective layers 13a and 13b.

Alternatively, as illustrated in FIG. 10D, in the low flexibility region E2, it is preferable that the pair of protective layers 13a and 13b be held by the support panel 15 and the light-emitting device (not illustrated) be placed between the pair of protective layers 13a and 13b.

It is preferable that the light-emitting device have the protective layer on only one of the light-emitting surface side and the side opposite to the light-emitting surface side because the electronic device can be thinner or more lightweight. For example, an electronic device that includes the protective layer 13b and does not include the protective layer 13a may be employed.

When the protective layer 13a on the light-emitting surface side of the light-emitting device is a light-blocking film, a non-light-emitting region of the light-emitting device can be prevented from being irradiated with external light. This structure is preferable because it prevents photodegradation of a transistor and the like of a driver circuit that is included in the non-light-emitting region.

As illustrated in FIG. 10E, an opening in the protective layer 13a provided on the light-emitting surface side of the light-emitting device 11 overlaps with a light-emitting region 11a of the light-emitting device. The protective layer 13a overlaps with a non-light-emitting region 11b that surrounds the light-emitting region 11a like a frame. The protective layer 13b provided on the side opposite to the light-emitting surface side of the light-emitting device 11 overlaps with the light-emitting region 11a and the non-light-emitting region 11b. The protective layer 13b is provided in a large region, preferably on the entire surface on the side opposite to the light-emitting surface side to strongly protect the light-emitting device; thus, the reliability of the electronic device can be improved.

The protective layer and the support panel can be formed using plastic, a metal, an alloy, rubber, or the like. Plastic, rubber, or the like is preferably used because it can form a protective layer or a support panel that is lightweight and less likely to be broken. For example, silicone rubber may be used for the protective layer and stainless steel or aluminum may be used for the support panel.

The protective layer and the support panel are preferably formed using a material with high toughness. In that case, an electronic device with high impact resistance that is less likely to be broken can be provided. For example, when an organic resin, a thin metal material, or a thin alloy material is used for the protective layer and the support panel, the electronic device can be lightweight and less likely to be broken. For a similar reason, also a substrate of the light-emitting device is preferably formed using a material with high toughness.

The protective layer and the support panel on the light-emitting surface side do not necessarily have a light-transmitting property if they do not overlap with the light-emitting region of the light-emitting device. When the protective layer and the support panel on the light-emitting surface side overlap with at least part of the light-emitting region, they are preferably formed using a material that transmits light emitted from the light-emitting device. There is no limitation on the light-transmitting property of the protective layer and the support panel on the side opposite to the light-emitting surface side.

When any two of the protective layer, the support panel, and the light-emitting device are bonded to each other, any of a variety of adhesives can be used, and for example, a curable resin that is curable at room temperature (e.g., a two-component-mixture-type resin), a light curable resin, a heat curable resin, or the like can be used. Alternatively, a sheet-like adhesive may be used. Alternatively, components of the electronic device may be fixed with, for example, a screw that penetrates two or more of the protective layer, the support panel, and the light-emitting device or a pin or clip that holds them.

The electronic device of this embodiment can be used with one light-emitting device (one light-emitting region) divided into two or more regions at a folded portion(s). For example, it is possible to put the region that is hidden by folding the electronic device in a non-light-emitting state and put only the exposed region in a light-emitting state. Thus, power consumed by a region that is not used by a user can be reduced.

The electronic device of this embodiment may include a sensor for determining whether each high flexibility region is bent or not. The sensor can be composed of, for example, a switch, a MEMS pressure sensor, a pressure sensor, or the like.

Figure 11A:
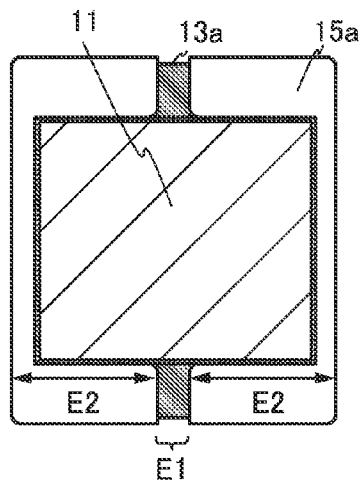
FIGS. 11A to 11C illustrate an electronic device.
Figure 11B:
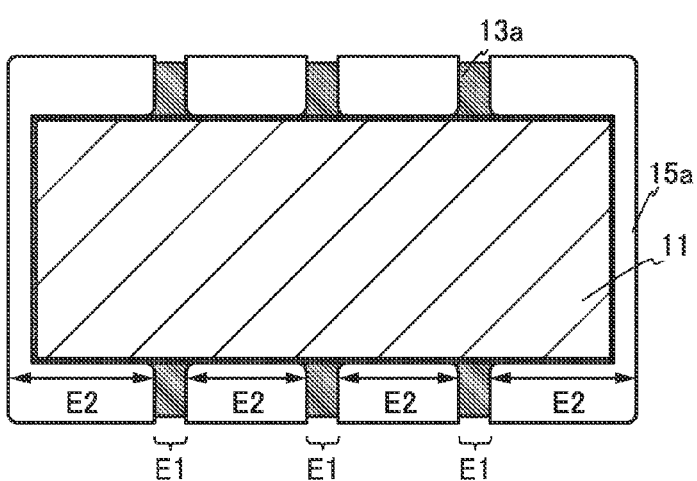
Figure 11C:
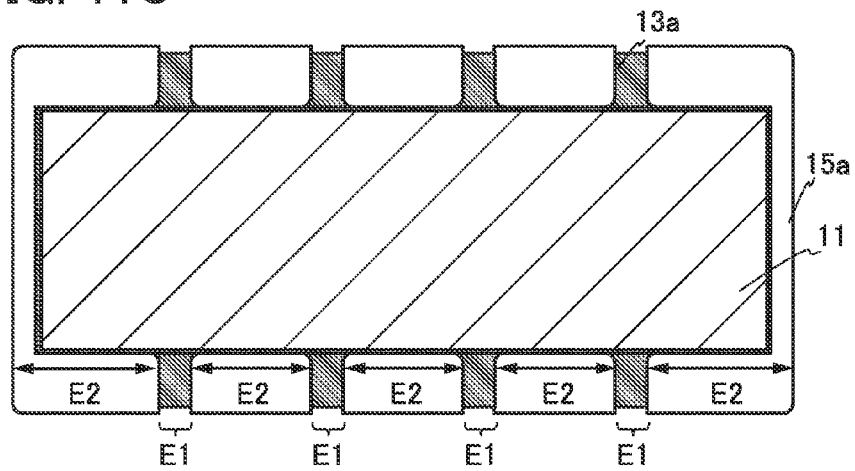

In the examples described above, the electronic device includes two high flexibility regions; however, one embodiment of the present invention is not limited thereto. For example, as illustrated in FIG. 11A, the electronic device includes at least one high flexibility region E1. Embodiments of the present invention also include an electronic device that includes three high flexibility regions E1 and can be folded in four parts (FIG. 11B) and an electronic device that includes four high flexibility regions E1 and can be folded in five parts (FIG. 11C).

This embodiment can be combined with any of the other embodiments as appropriate.

(Embodiment 3)

In this embodiment, electronic devices and lighting devices to which one embodiment of the present invention is applied will be described with reference to FIGS. 12A to 12G.

Electronic devices and lighting devices can have high reliability when manufactured using the light-emitting device of one embodiment of the present invention. Highly reliable flexible electronic devices and highly reliable flexible lighting devices can be manufactured by adopting the light-emitting device of one embodiment of the present invention.

Examples of electronic devices are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

The light-emitting device of one embodiment of the present invention has flexibility and thus can be incorporated along a curved inside/outside wall surface of a house or a building or a curved interior/exterior surface of a car.

Figure 12A:
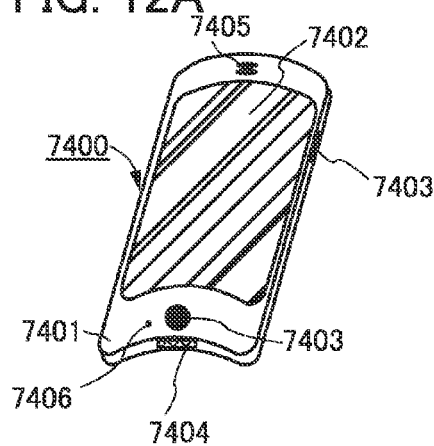
FIGS. 12A to 12G illustrate electronic devices.

FIG. 12A illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured using the light-emitting device of one embodiment of the present invention in the display portion 7402. In accordance with one embodiment of the present invention, a highly reliable cellular phone having a curved display portion can be provided at a high yield.

When the display portion 7402 of the cellular phone 7400 illustrated in FIG. 12A 10 is touched with a finger or the like, data can be input to the cellular phone 7400. Further, operations such as making a call and inputting a character can be performed by touch on the display portion 7402 with a finger or the like.

The power can be turned on or off with the operation button 7403. In addition, types of images displayed on the display portion 7402 can be switched; for example, switching images from a mail creation screen to a main menu screen is performed with the operation button 7403.

Figure 12B:
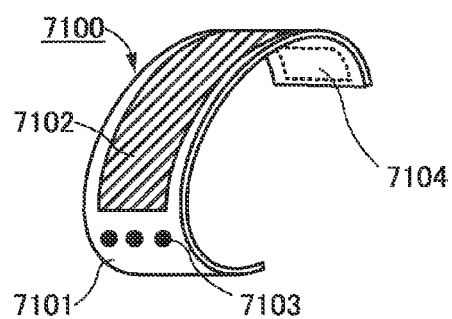

FIG. 12B is an example of a wristband-type portable display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes the light-emitting device of one embodiment of the present invention. In accordance with one embodiment of the present invention, a highly reliable portable display device having a curved display portion can be provided at a high yield.

Figure 12C:
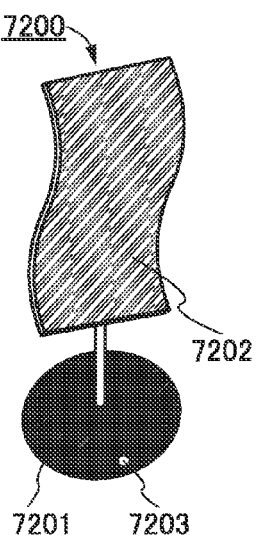
Figure 12D:
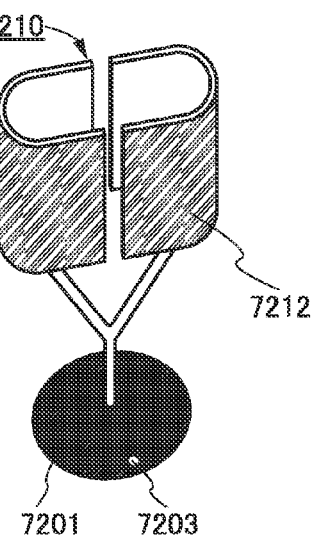
Figure 12E:
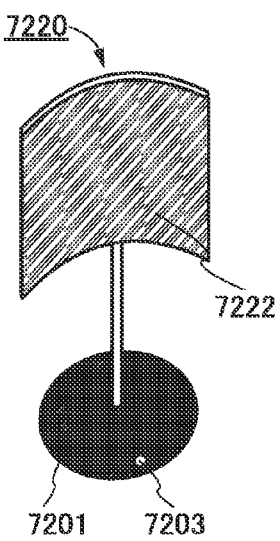

FIGS. 12C to 12E illustrate examples of lighting devices. Lighting devices 7200, 7210, and 7220 each include a stage 7201 provided with an operation switch 7203 and a light-emitting portion supported by the stage 7201.

The lighting device 7200 illustrated in FIG. 12C includes a light-emitting portion 7202 with a wave-shaped light-emitting surface and thus is a good-design lighting device.

A light-emitting portion 7212 included in the lighting device 7210 illustrated in FIG. 12D has two convex-curved light-emitting portions symmetrically placed. Thus, light radiates from the lighting device 7210.

The lighting device 7220 illustrated in FIG. 12E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion may be fixed on a plastic member, a movable frame, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular area can be brightly illuminated, or the light-emitting surface is curved to have a convex shape, whereby a whole room can be brightly illuminated.

Here, each light-emitting portion includes the light-emitting device of one embodiment of the present invention. In accordance with one embodiment of the present invention, a highly reliable lighting device having a curved light-emitting portion can be provided at a high yield.

Figure 12F:
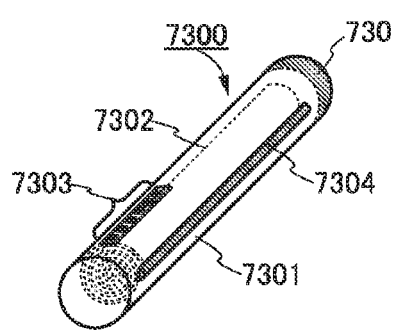

FIG. 12F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

With the operation buttons 7303, power ON/OFF, switching of displayed videos, and the like can be performed.

Figure 12G:
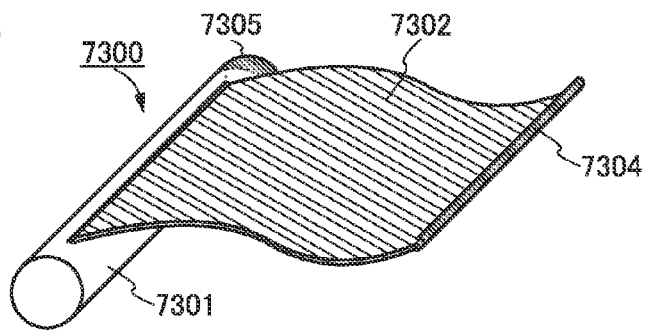

FIG. 12G illustrates the display device 7300 in a state in which the display portion 7302 is pulled out with the display portion pull 7304. Videos can be displayed on the display portion 7302 in this state. Further, the operation buttons 7303 on the surface of the housing 7301 allow one-handed operation. The operation button 7303 is provided not in the center of the housing 7301 but on one side of the housing 7301 as illustrated in FIG. 12F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes the light-emitting device of one embodiment of the present invention. In accordance with one embodiment of the present invention, a lightweight and highly reliable light-emitting device can be provided at a high yield.

This embodiment can be combined with any of the other embodiments as appropriate.

This application is based on Japanese Patent Application serial no. 2013-160042 filed with Japan Patent Office on Aug. 1, 2013, the entire contents of which are hereby incorporated by reference.

What is claimed is:

1. A light-emitting device comprising:
a first flexible substrate;
a second flexible substrate;
an element layer between the first flexible substrate and the second flexible substrate;
a first bonding layer between the first flexible substrate and the element layer; and
a second bonding layer between the second flexible substrate and the element layer,
wherein the element layer comprises a light-emitting element,
wherein the first bonding layer and the second bonding layer extend beyond an end portion of the element layer and are in contact with each other, and
wherein the first flexible substrate and the second flexible substrate extend beyond the end portion of the element layer, an end portion of the first bonding layer, and an end portion of the second bonding layer and are in direct contact with each other.

2. The light-emitting device according to claim 1, wherein the second bonding layer is in contact with a side surface of the end portion of the element layer.

3. The light-emitting device according to claim 1, wherein the second flexible substrate is in contact with side surfaces of the end portions of the first bonding layer and the second bonding layer.

4. The light-emitting device according to claim 1, wherein an absolute value of a difference between a thermal expansion coefficient of the first flexible substrate and a thermal expansion coefficient of the second flexible substrate is smaller than or equal to 10% of the thermal expansion coefficient of the first flexible substrate or the thermal expansion coefficient of the second flexible substrate.

5. The light-emitting device according to claim 1, wherein the first flexible substrate and the second flexible substrate comprise a same material.

6. A light-emitting device comprising:
a first flexible substrate;
a second flexible substrate;
an element layer between the first flexible substrate and the second flexible substrate;
a first bonding layer between the first flexible substrate and the element layer;
a second bonding layer between the second flexible substrate and the element layer, and
a third bonding layer between the first flexible substrate and the second flexible substrate,
wherein the element layer comprises a light-emitting element,
wherein the first flexible substrate and the second flexible substrate extend beyond an end portion of the element layer, an end portion of the first bonding layer, and an end portion of the second bonding layer,
wherein the first flexible substrate and the second flexible substrate overlap with each other with the third bonding layer therebetween in a region not overlapping with the element layer, the first bonding layer, and the second bonding layer, and
wherein the second flexible substrate is in direct contact with side surfaces of the end portions of the element layer, the first bonding layer, and the second bonding layer.

7. The light-emitting device according to claim 6, wherein the third bonding layer does not overlap with the element layer, the first bonding layer, and the second bonding layer.

8. The light-emitting device according to claim 6, wherein the third bonding layer is in contact with a side surface of the end portion of the first bonding layer.

9. The light-emitting device according to claim 6, wherein the third bonding layer comprises a low-melting-point glass or a thermoplastic resin.

10. The light-emitting device according to claim 6, wherein an absolute value of a difference between a thermal expansion coefficient of the first flexible substrate and a thermal expansion coefficient of the second flexible substrate is smaller than or equal to 10% of the thermal expansion coefficient of the first flexible substrate or the thermal expansion coefficient of the second flexible substrate.

11. The light-emitting device according to claim 6, wherein the first flexible substrate and the second flexible substrate comprise a same material.

12. A light-emitting device comprising:
a first flexible substrate;
a second flexible substrate;
an element layer between the first flexible substrate and the second flexible substrate;
a first bonding layer between the first flexible substrate and the element layer; and
a second bonding layer between the second flexible substrate and the element layer,
wherein the element layer comprises a light-emitting element,
wherein the first flexible substrate, the second flexible substrate, and the second bonding layer extend beyond an end portion of the element layer and an end portion of the first bonding layer, and
wherein the first flexible substrate and the second flexible substrate overlap with each other with the second bonding layer therebetween in a region not overlapping with the element layer and the first bonding layer.

13. The light-emitting device according to claim 12, wherein the first flexible substrate and the second flexible substrate extend beyond the end portion of the element layer, the end portion of the first bonding layer, and an end portion of the second bonding layer and are in contact with each other.

14. The light-emitting device according to claim 12, wherein the second bonding layer is in contact with side surfaces of the end portions of the element layer and the first bonding layer.

15. The light-emitting device according to claim 13, wherein the second flexible substrate is in contact with a side surface of the end portion of the second bonding layer.

16. The light-emitting device according to claim 12, wherein an absolute value of a difference between a thermal expansion coefficient of the first flexible substrate and a thermal expansion coefficient of the second flexible substrate is smaller than or equal to 10% of the thermal expansion coefficient of the first flexible substrate or the thermal expansion coefficient of the second flexible substrate.

17. The light-emitting device according to claim 12, wherein the first flexible substrate and the second flexible substrate comprise a same material.

* * * * *